United States Patent
Maejima

(10) Patent No.: US 10,797,073 B2
(45) Date of Patent: Oct. 6, 2020

(54) MEMORY SYSTEM AND SEMICONDUCTOR MEMORY DEVICE

(71) Applicant: Toshiba Memory Corporation, Minato-ku (JP)

(72) Inventor: Hiroshi Maejima, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 47 days.

(21) Appl. No.: 16/284,086

(22) Filed: Feb. 25, 2019

(65) Prior Publication Data
US 2020/0091175 A1 Mar. 19, 2020

(30) Foreign Application Priority Data
Sep. 14, 2018 (JP) .................. 2018-172868

(51) Int. Cl.
| | |
|---|---|
| H01L 27/115 | (2017.01) |
| H01L 27/11582 | (2017.01) |
| H01L 27/11556 | (2017.01) |
| G11C 16/04 | (2006.01) |
| G11C 16/34 | (2006.01) |
| G11C 16/26 | (2006.01) |
| H01L 27/11519 | (2017.01) |
| H01L 27/11565 | (2017.01) |
| G11C 16/10 | (2006.01) |

(52) U.S. Cl.
CPC .... *H01L 27/11582* (2013.01); *G11C 16/0483* (2013.01); *G11C 16/10* (2013.01); *G11C 16/26* (2013.01); *G11C 16/3459* (2013.01); *H01L 27/11519* (2013.01); *H01L 27/11556* (2013.01); *H01L 27/11565* (2013.01)

(58) Field of Classification Search
CPC ...................................... H01L 27/115
USPC ...................................... 365/185.01
See application file for complete search history.

(56) References Cited

U.S. PATENT DOCUMENTS

| | | | |
|---|---|---|---|
| 8,902,657 B2 | 12/2014 | Iwai et al. | |
| 10,062,429 B1* | 8/2018 | Borole | G06F 9/30123 |
| 2016/0260483 A1 | 9/2016 | Shano et al. | |
| 2017/0062456 A1 | 3/2017 | Sugino et al. | |

* cited by examiner

*Primary Examiner* — Jason Lappas
(74) *Attorney, Agent, or Firm* — Oblon, McClelland, Maier & Neustadt, L.L.P.

(57) ABSTRACT

According to one embodiment, a memory system includes: a semiconductor memory device; and a controller. The semiconductor memory device includes: first interconnection layers; second interconnection layers; a semiconductor pillar. The semiconductor memory device executes an operation in a first mode or in a second mode. In the first mode, the device selects a third interconnection layer among the first interconnection layers independently with a fourth interconnection layer among the second interconnection layers. In the second mode, the device selects a fifth interconnection layer among the first interconnection layers and sixth interconnection layer among the second interconnection layers in a batch. The controller sends an instruction to the device to execute the operation in the first mode or the second mode.

20 Claims, 25 Drawing Sheets

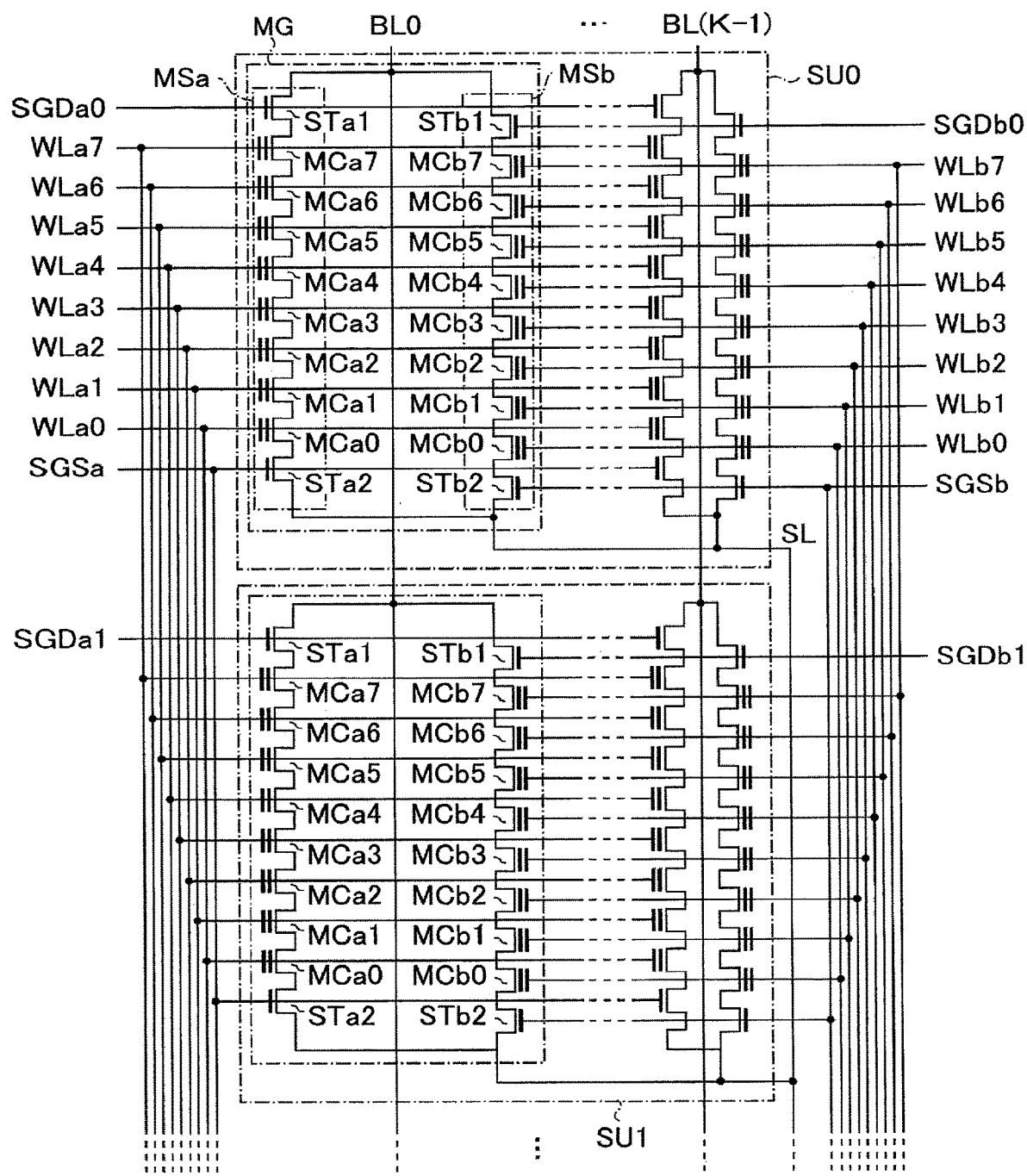
F I G. 3

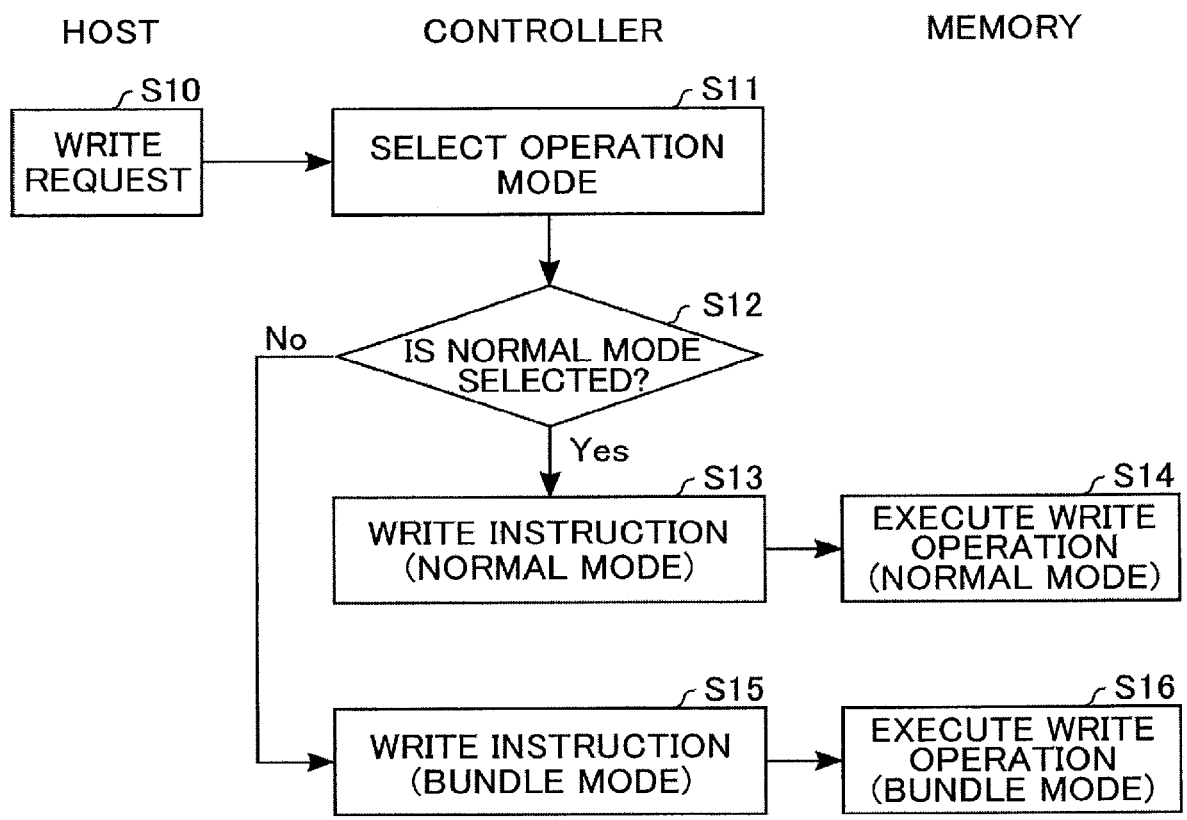
F I G. 9

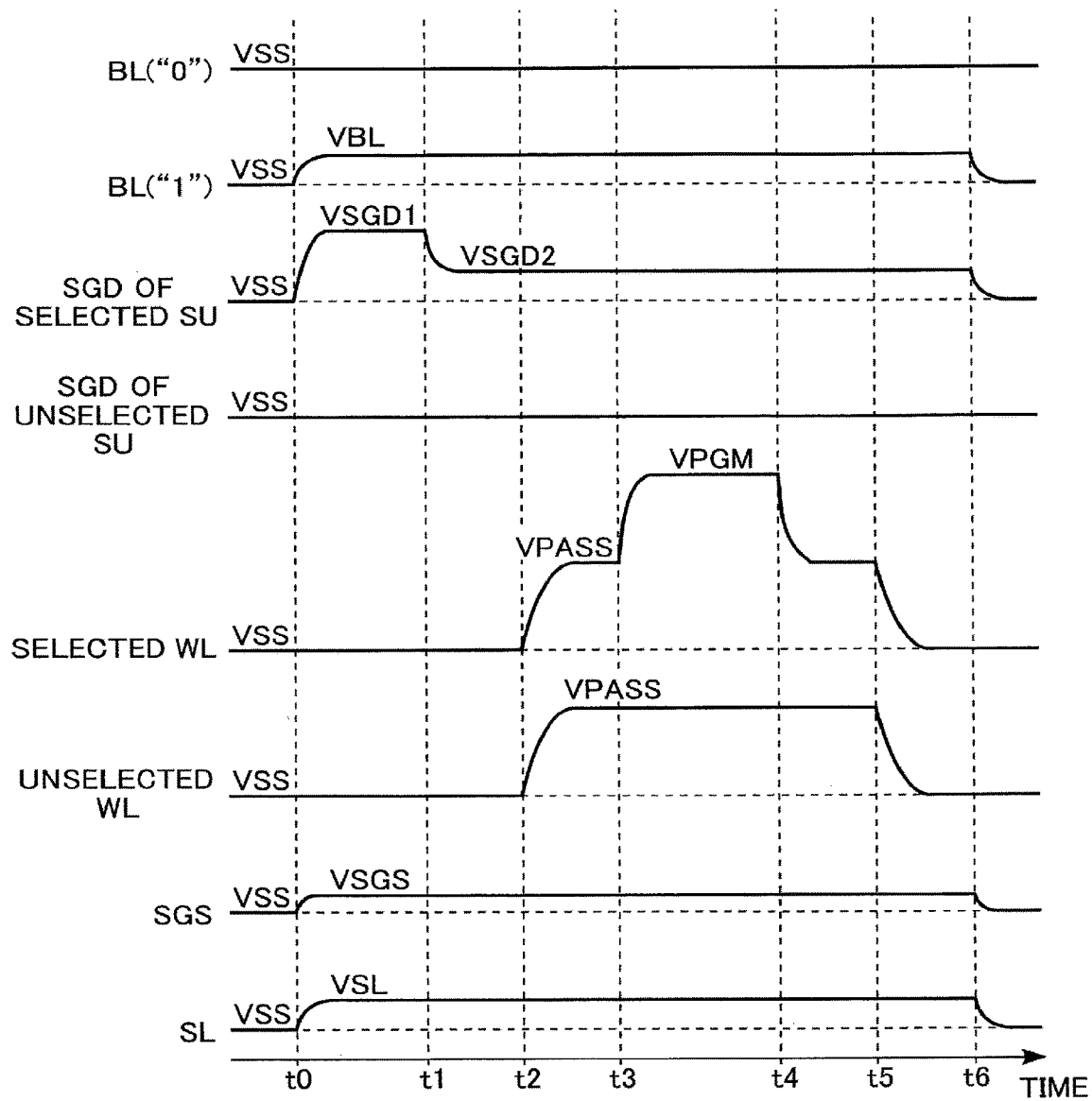
F I G. 14

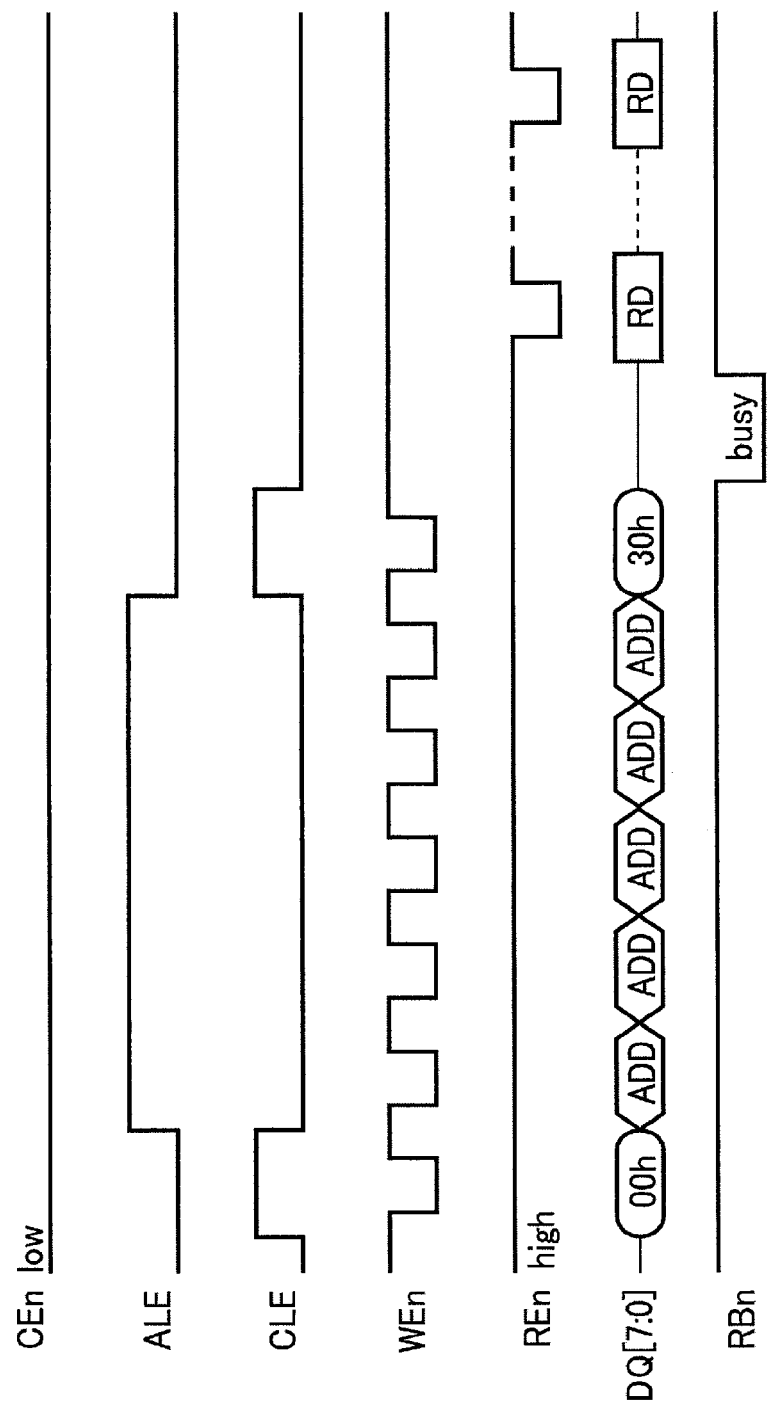
F I G. 16

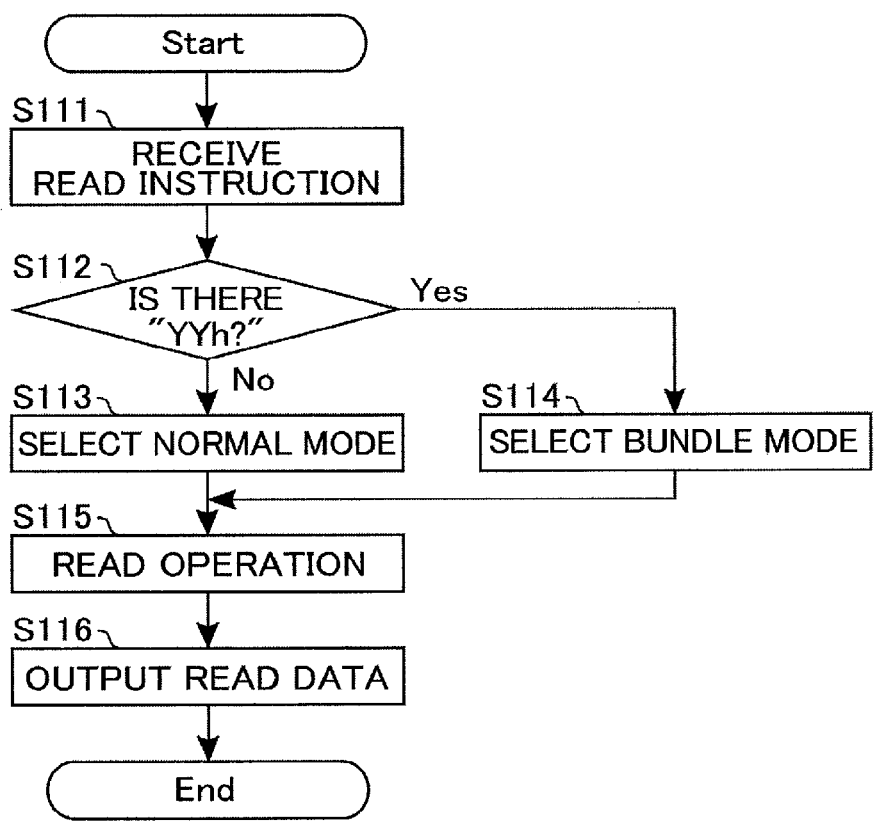
F I G. 18

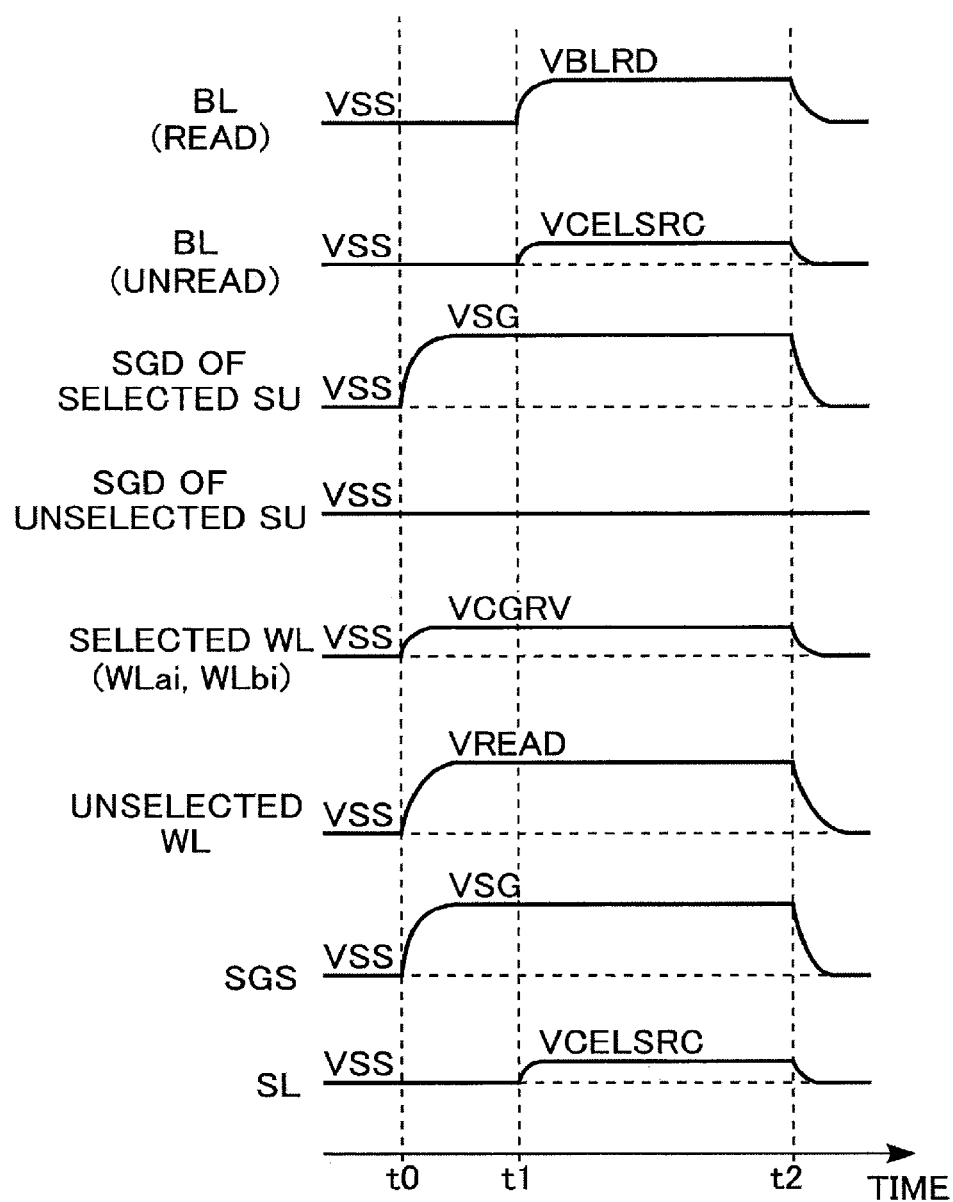
F I G. 21

| PRE-SHIPPING INSPECTION (CHECK OF SHORT-CIRCUITING BETWEEN WL$_s$) ||DECISION RESULT|OPERATION MODE|
|---|---|---|---|
|INTRA-LAYER SHORT-CIRCUITING|INTER-LAYER SHORT-CIRCUITING|||
|Pass|Pass|NORMAL BLK|NORMAL MODE|
|Fail|Pass|INTRA-LAYER SHORT-CIRCUITING OCCURS|BUNDLE MODE|
|Fail/Pass|Fail|UNUSABLE (BAD BLOCK CONVERSION)||

F I G. 22

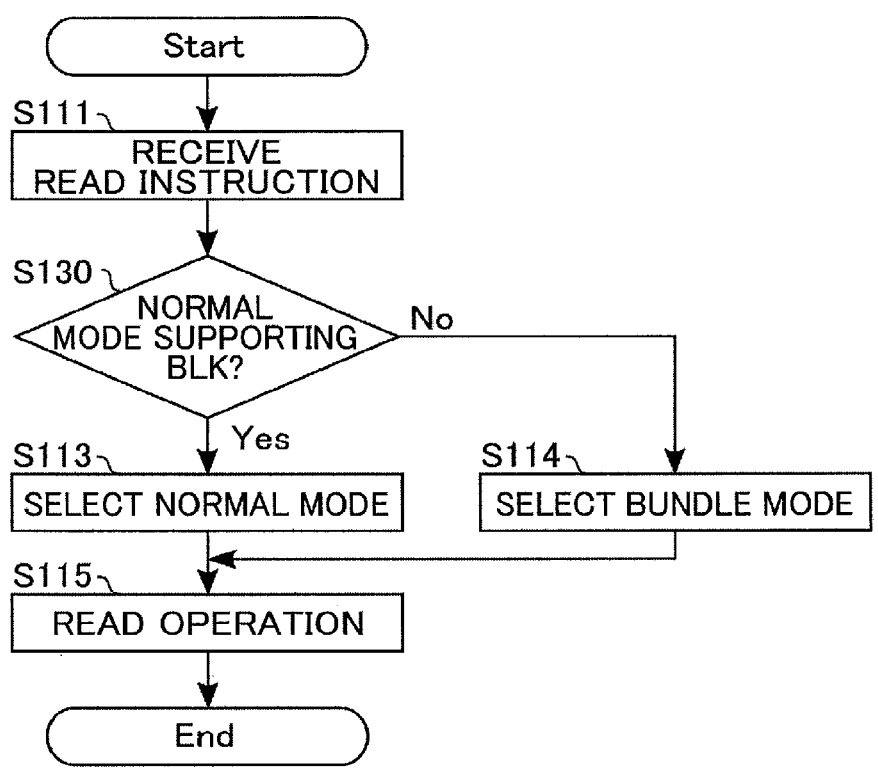
F I G. 25

MEMORY SYSTEM AND SEMICONDUCTOR MEMORY DEVICE

CROSS-REFERENCE TO RELATED APPLICATIONS

This application is based upon and claims the benefit of priority from Japanese Patent Application No. 2018-172868, filed Sep. 14, 2018, the entire contents of which are incorporated herein by reference.

FIELD

Embodiments described herein relate generally to a memory system and a semiconductor memory device.

BACKGROUND

There is a known memory system as a semiconductor memory device for which a NAND-type flash memory is used.

BRIEF DESCRIPTION OF THE DRAWINGS

FIG. 3 is a circuit diagram of a memory cell array of the semiconductor memory device according to the first embodiment;

FIG. 9 is a flowchart showing an entire flow of a write operation of the memory system according to the first embodiment;

FIG. 14 is a timing chart showing a voltage of each interconnection in the write operation of the semiconductor memory device according to the first embodiment;

FIG. 16 is a command sequence of the read operation in the normal mode of the memory system according to the first embodiment;

FIG. 18 is a flowchart of the read operation of the semiconductor memory device according to the first embodiment;

FIG. 21 is a timing chart showing a voltage of each interconnection in the read operation in the bundle mode of the semiconductor memory device according to the first embodiment;

FIG. 22 is a table showing a relationship between a shipping result of the semiconductor memory device and an operation mode according to a first example of a second embodiment;

FIG. 25 is a flowchart in the read operation of the semiconductor memory device according to the third embodiment.

DETAILED DESCRIPTION

In general, according to one embodiment, a memory system includes: a semiconductor memory device; and a controller configured to control the semiconductor memory device. The semiconductor memory device includes: a plurality of first interconnection layers stacked in a first direction; a plurality of second interconnection layers stacked in the first direction, the second interconnection layers respectively disposed apart from one of the first interconnection layers in a second direction intersecting the first direction; a semiconductor pillar provided between the first interconnection layers and the second interconnection layers, and extending in the first direction; a first charge storage layer disposed between the first interconnection layers and the semiconductor pillar; a second charge storage layer disposed between the second interconnection layers and the semiconductor pillar. The semiconductor memory device is configured to execute an operation in a first mode or in a second mode. In the first mode, the device selects a third interconnection layer among the first interconnection layers independently with a fourth interconnection layer among the second interconnection layers disposed apart in the second direction from the third interconnection layer. In the second mode, the device selects a fifth interconnection layer among the first interconnection layers, and sixth interconnection layer among the second interconnection layers disposed apart in the second direction from the fifth interconnection layer in a batch. The controller is configured to send an instruction to the device to execute the operation in the first mode or the second mode.

1. First Embodiment

A memory system and a semiconductor memory device according to the first embodiment will be described. A three-dimensionally stacked NAND-type flash memory formed by three-dimensionally stacking memory cell transistors above a semiconductor substrate will be described below as an example of the semiconductor memory device.

1.1 Configuration 1.1.1 Overall Configuration of Memory System

First, an overall configuration of the memory system according to the present embodiment will be described with reference to FIG. 1.

Figure 1:
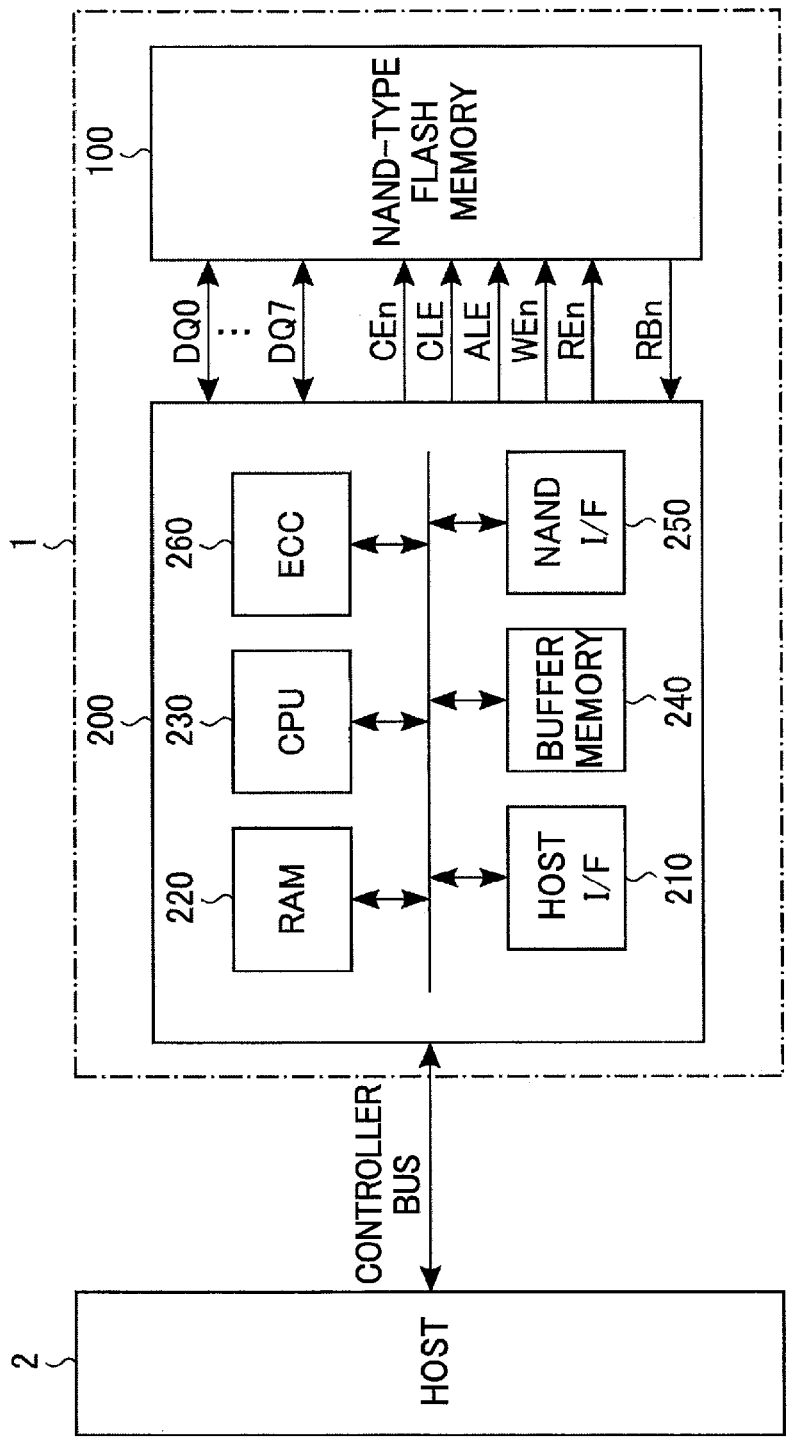
FIG. 1 is a block diagram of a memory system according to a first embodiment.

As shown in FIG. 1, a memory system 1 includes a NAND-type flash memory 100 (simply referred to as a "memory 100" below) and a controller 200. The controller 200 and the memory 100 may be, for example, combined to form one semiconductor memory device, and an example of the combination is a memory card such as an SD™ card or an SSD (solid state drive).

The memory 100 includes a plurality of memory cell transistors, and stores data in a non-volatile manner. The memory 100 is coupled to the controller 200 by a NAND bus, and operates based on an instruction from the controller 200. More specifically, the memory 100 transmits and receives, for example, an 8-bit signal DQ [7:0] to and from the controller 200. The signal DQ [7:0] is, for example, data, an address, and a command.

Furthermore, the memory 100 receives from the controller 200, for example, a chip enable signal CEn, a command latch enable signal CLE, an address latch enable signal. ALE, a write enable signal WEn, and a read enable signal REn. Furthermore, the memory 100 transmits a ready/busy signal RBn to the controller 200.

The chip enable signal CEn is a signal for enabling the memory 100, and is asserted at, for example, a Low (L) level. The command latch enable signal CLE is a signal indicating that the signal DQ is a command, and is asserted at, for example, a High (H) level. The address latch enable signal ALE is a signal indicating that the signal DQ is an address, and is asserted at, for example, an "H" level. The write enable signal WEn is a signal for taking a received signal in the memory 100, and is asserted at, for example, an "L" level every time the command, the address, and the data are received from the controller 200. Hence, every time WEn is toggled, the signal DQ is taken in by the memory 100. The read enable signal REn is a signal for allowing the controller 200 to read data from the memory 100. The read enable signal REn is asserted at, for example, an "L" level. The ready/busy signal RBn is a signal indicating whether or not the memory 100 is in a busy state (whether the memory 100 cannot or can receive the command from the controller 200), and is at the "L" level when, for example, the memory 100 is in the busy state.

The controller 200 instructs the memory 100 to perform a read operation, a write operation, and an erase operation of data in response to a request (instruction) from a host device 2. Furthermore, the controller 200 manages a memory space of the memory 100.

The controller 200 includes a host interface circuit 210, a built-in memory (RAM; random access memory) 220, a processor (CPU; central processing unit) 230, a buffer memory 240, a NAND interface circuit 250, and an ECC circuit 260.

The host interface circuit 210 is coupled to the host device 2 via a controller bus, and controls communication with host device 2. The host interface circuit 210 transfers a request and data received from the host device 2 to the processor 230 and the buffer memory 240, respectively. Furthermore, the host interface circuit 210 transfers data in the buffer memory 240 to the host device 2 in response to an instruction of the processor 230.

The NAND interface circuit 250 is coupled to the memory 100 via the NAND bus, and controls communication with the memory 100. The NAND interface circuit 250 transfers the instruction issued by the processor 230 to the memory 100. Furthermore, the NAND interface circuit 250 transfers write data in the buffer memory 240 to the memory 100 during the write operation. Furthermore, the NAND interface circuit 250 transfers data read from the memory 100 to the buffer memory 240 during the read operation.

The processor 230 controls an entire operation of the controller 200. When, for example, receiving a write request (including a command, a logical address, and data) from the host device 2, the processor 230 issues a write instruction (including a command, a physical address, and data) with respect to the memory 100 in response to reception. The same also applies when the read operation and the erase operation are performed.

The memory system 1 according to the present embodiment includes two operation modes of a normal mode and a bundle mode in the write operation and the read operation. The processor 230 selects (designates) one of the operation modes according to the physical address of the memory 100 which is a write operation or read operation target, and issues a write instruction or a read instruction matching the selected operation mode. The two operation modes will be described in detail later.

Furthermore, the processor 230 executes various types of processing such as wear leveling for managing the memory 100. Furthermore, the processor 230 executes various types of arithmetic operations. For example, the processor 230 executes data encryption processing and randomize processing.

The ECC circuit 260 executes data error correction (ECC: error checking and correcting) processing.

The built-in memory 220 is a semiconductor memory such as a DRAM, and is used as a working area of the processor 230. The built-in memory 220 holds firmware for managing the memory 100, and various management tables. For example, the built-in memory 220 stores information (referred to as "block address information" below) which is read from the memory 100 and associates the physical address (block address) of the memory 100 and the two operation modes.

The buffer memory 240 temporarily stores read data received by the controller 200 from the memory 100, and write data received from the host device 2.

1.1.2 Configuration of Semiconductor Memory Device

Next, the configuration of the semiconductor memory device will be described with reference to FIG. 2. In addition, FIG. 2 shows part of coupling between each block as arrow lines, yet coupling between blocks is not limited to these.

Figure 2:
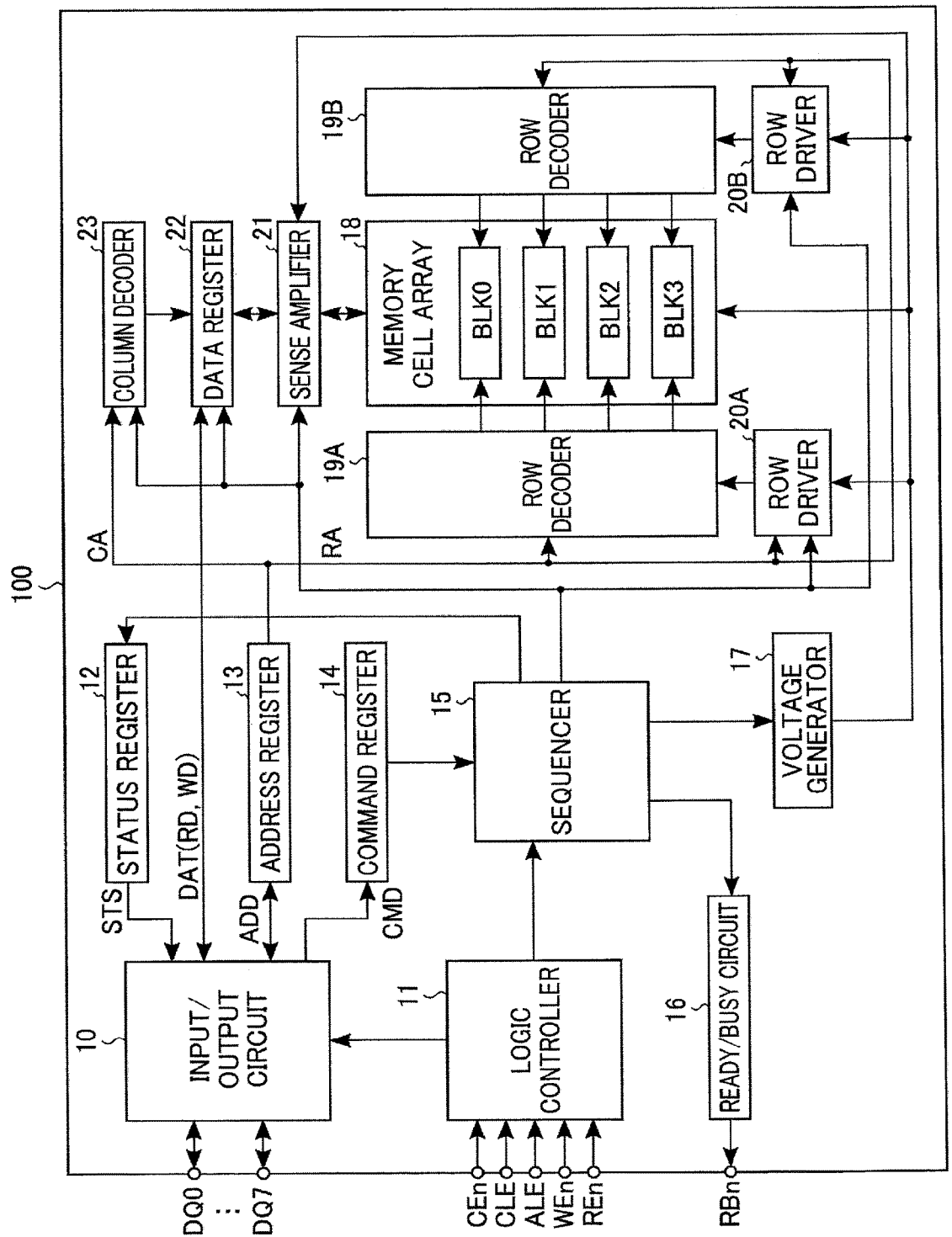
FIG. 2 is a block diagram of a semiconductor memory device according to the first embodiment.

As shown in FIG. 2, the memory 100 includes an input/output circuit 10, a logic controller 11, a status register 12, an address register 13, a command register 14, a sequencer 15, a ready/busy circuit 16, a voltage generator 17, a memory cell array 18, a row decoder 19 (19A and 19B), a row driver 20 (20A and 20B), a sense amplifier 21, a data register 22, and a column decoder 23.

The input/output circuit 10 controls input and output of the signal DQ to and from the controller 200. More specifically, the input/output circuit 10 includes an input circuit and an output circuit. The input circuit transmits data DAT (write data WD) received from the controller 200 to the data register 22, transmits an address ADD to the address register 13, and transmits a command CMD to the command register 14. The output circuit transmits status information STS received from the status register 12, the data DAT (read data RD) received from the data register 22, and the address ADD received from the address register 13 to the controller 200. The input/output circuit 10 and the data register 22 are coupled via a data bus.

The logic controller 11 receives from the controller 200 the chip enable signal CEn, the command latch enable signal CLE, the address latch enable signal ALE, the write enable signal WEn, and the read enable signal REn. Furthermore, the logic controller 11 controls the input/output circuit 10 and the sequencer 15 according to the received signal.

The status register 12 temporarily holds the status information STS received from the sequencer 15 in, for example, the write operation, the read operation, and the erase operation of data, and notifies the controller 200 of whether or not an operation was normally finished.

The address register 13 temporarily holds the address ADD received from the controller 200 via the input/output circuit 10. Furthermore, the address register 13 transfers, for example, a row address RA (including a block address and a page address) to the row decoders 19A and 19B and the row drivers 20A and 20B, and transfers a column address CA to the column decoder 23.

The command register 14 temporarily stores the command CMD received from the controller 200 via the input/output circuit 10, and transfers the command CMD to the sequencer 15.

The sequencer 15 controls the entire operation of the memory 100. More specifically, the sequencer 15 controls, for example, the status register 12, the ready/busy circuit 16, the voltage generator 17, the row decoders 19A and 19B, the row drivers 20A and 20B, the sense amplifier 21, the data register 22, and the column decoder 23 according to the command CMD held by the command register 14, and executes the write operation, the read operation, and the erase operation.

The ready/busy circuit 16 transmits the ready/busy signal RBn to the controller 200 under control of the sequencer 15.

The voltage generator 17 generates the necessary voltage for the write operation, the read operation, and the erase operation under control of the sequencer 15, and supplies this generated voltage to, for example, the memory cell array 18, the row drivers 20A and 20B, and the sense amplifier 21.

The memory cell array 18 includes, for example, four blocks BLK0 to BLK3 including non-volatile memory cell transistors (also referred to as "memory cells" below) associated with rows and columns. In addition, the number of blocks BLK in the memory cell array 18 is optional. Details of a configuration of the memory cell array 18 will be described later.

The memory cell array 18 includes a user region and a management region as a memory space region and, for example, a plurality of blocks BLK is allocated to the user region and the management region. The user region is a region used for the write operation and the read operation of user data received from the host device 2. The management region is, for example, a region in which a control program or management data such as various setting parameters is stored. For example, block address information is stored in the management region.

The row decoder 19 includes the row decoders 19A and 19B. The row decoders 19A and 19B are coupled to respectively different interconnections disposed along a row direction in each block BLK. The row decoders 19A and 19B include block decoders (not shown) associated with each block BLK. The block decoder decodes an address (block address) received from the controller 200. The row decoders 19A and 19B select one of the blocks BLK based on a decoding result. In other words, the row decoders 19A and 19B are controlled by (the address received from) the controller 200. Furthermore, the row decoders 19A and 19B apply to the selected block BLK the voltages supplied from the row drivers 20A and 20B, respectively. The row decoders 19A and 19B perform operations corresponding to the normal mode and the bundle mode.

The row driver 20 includes the row drivers 20A and 20B. The row drivers 20A and 20B supply the necessary voltages for the write operation, the read operation, and the erase operation to the row decoders 19A and 19B, respectively, according to the row address RA.

The sense amplifier 21 senses data read from the memory cell array 18 during the read operation. Furthermore, the sense amplifier 21 transmits the read data RD to the data register 22. Furthermore, the sense amplifier 21 transmits the write data WD to the memory cell array 18 during the write operation.

The data register 22 includes a plurality of latch circuits. Each latch circuit holds the write data WD and the read data RD. For example, in the write operation, the data register 22 temporarily holds the write data WD received from the input/output circuit 10, and transmits the write data WD to the sense amplifier 21. Furthermore, for example, in the read operation, the data register 22 temporarily holds the read data RD received from the sense amplifier 21, and transmits the read data RD to the input/output circuit 10.

The column decoder 23 decodes the column address CA in, for example, the write operation, the read operation, and the erase operation, and selects the latch circuits in the data register 22 according to the decoding result.

1.1.3 Circuit Configuration of Memory Cell Array

Next, the circuit configuration of the memory cell array 18 will be described with reference to FIG. 3. FIG. 3 shows a circuit diagram of the memory cell array 18 in the one block BLK.

As shown in FIG. 3, the block BLK includes a plurality of string units SU (SU0, SU1, and . . . ). In addition, the number of the string units SU in the block BLK is optional. Furthermore, each string unit SU includes a plurality of memory groups MG. Each of the memory groups MG includes two memory strings MSa and MSb. The memory strings MSa and MSb will be referred to as memory strings MS below unless respectively specified.

The memory string MSa includes, for example, eight memory cell transistors MCa0 to MCa7 and select transistors STa1 and STa2. Similarly, the memory string MSb includes, for example, eight memory cell transistors MCb0 to MCb7 and select transistors STb1 and STb2. The memory cell transistors MCa0 to MCa7 and MCb0 to MCb7 will be referred to as memory cell transistors MC below unless respectively specified. Furthermore, the select transistors STa1 and STb1 will be referred to as select transistors ST1 unless respectively specified, and the select transistors STa2 and STb2 will be referred to as select transistors ST2 unless respectively specified.

The memory cell transistor MC includes a control gate and a charge storage layer, and holds data in a non-volatile manner. In addition, the memory cell transistor MC may be a MONOS type which uses an insulating layer for the charge storage layer, or may be an FG type which uses a conductive layer for the charge storage layer. The present embodiment will describe the MONOS type as an example. Furthermore, the number of the memory cell transistors MC included in each memory string MS may be 16, 32, 48, 64, 96, or 128, yet is not limited to these. Furthermore, the number of the select transistors ST1 and ST2 included in each memory string MS is optional, and only needs to be one or more.

The memory cell transistors MC included in the memory string MS and the select transistors ST1 and ST2 are coupled in series. More specifically, in the memory string MSa, each current path is coupled in series in order of the select transistor STa2, the memory cell transistors MCa0 to MCa7, and the select transistor STa1. Similarly, in the memory string MSb, too, each current path is coupled in series in order of the select transistor STb2, the memory cell transistors MCb0 to MCb7, and the select transistor STb1. Furthermore, a drain of the select transistor STa1 and a drain of the select transistor STb1 included in the memory group MG are coupled in common to one of a plurality of bit lines BL (BL0, . . . , and BL(K−1), and (K−1) is an integer equal to or more than two). A plurality of bit lines BL is independently controlled by the sense amplifier 21. Furthermore, a source of the select transistor STa2 and a source of select transistor STb2 included in each memory group MG in the block BLK are coupled in common to a source line SL.

In the string unit SU, gates of a plurality of select transistors STa1 are coupled in common to a select gate line SGDa, and gates of a plurality of select transistors STb1 are coupled in common to a select gate line SGDb. More specifically, in a string unit SU0, gates of a plurality of select transistors STa1 are coupled in common to a select gate line SGDa0, and gates of a plurality of select transistors STb1 are coupled in common to a select gate line SGDb0. Similarly, in the string unit SU1, gates of a plurality of select transistors STa1 are coupled in common to a select gate line SGDa1. In the string unit SU1, gates of a plurality of select transistors STb1 are coupled in common to a select gate line SGDb1.

In the block BLK, gates of a plurality of select transistors STa2 are coupled in common to a select gate line SGSa, and gates of a plurality of select transistors STb2 are coupled in common to a select gate line SGSb. In addition, the select gate lines SGSa and SGSb may be provided per string unit SU.

The select gate lines SGDa (SGDa0, SGDa1, and . . . ) and SGDb (SGDb0, SGDb1, and . . . ) will be referred to as the select gate lines SGD unless respectively specified, and the select gate lines SGSa and SGSb will be referred to as select gate lines SGS unless respectively specified.

The select gate lines SGDa (SGDa0 to SGDa3) and SGSa are independently controlled by the row decoder 19A, and the select gate lines SGDb (SGDb0 to SGDb3) and SGSb are independently controlled by the row decoder 19B.

Control gates of a plurality of memory cell transistors MCa0 to MCa7 and MCb0 to MCb7 in the same block BLK are respectively coupled in common to word lines WLa0 to WLa7 and WLb0 to WLb7 provided per block BLK. The word lines WLa0 to WLa7 are independently controlled by the row decoder 19A, and the word lines WLb0 to WLb7 are independently controlled by the row decoder 19B. The word lines WLa and WLb will be referred to as word lines WL below unless respectively specified.

The block BLK is, for example, a data erasing unit, and data held in the memory cell transistor MC included in the same block BLK is erased in a batch. Furthermore, the write operation and the read operation are performed in a batch on a plurality of memory cell transistors MC coupled in common to the one word line WL of the one string unit SU. A set of one-bit data written in or read from each of the memory cell transistors MC which are selected in a batch during the write operation and the read operation of data will be referred to as a "page".

A plurality of memory groups MG disposed in the same column in the memory cell array 18 is coupled in common to one of the bit lines BL. That is, the bit line BL couples the one memory group MG of each string unit SU in common between a plurality of string units SU of a plurality of blocks BLK. The string unit SU includes a plurality of memory groups MG which is coupled to the different bit lines BL and is coupled to the same select gate line SGD. Furthermore, the block BLK includes a plurality of string units SU which uses the word line WL in common. In other words, the block BLK includes a plurality of word lines WL which are coupled in common to a plurality of string units SU in the block BLK. Furthermore, the memory cell array 18 includes a plurality of blocks BLK which uses the bit lines BL in common. The select gate lines SGS, the word lines WL, and the select gate line SGD are stacked above a semiconductor substrate in the memory cell array 18, so that the memory cell transistors MC are three-dimensionally stacked.

1.1.4 Planar Configuration of Memory Cell Array

Figure 4:
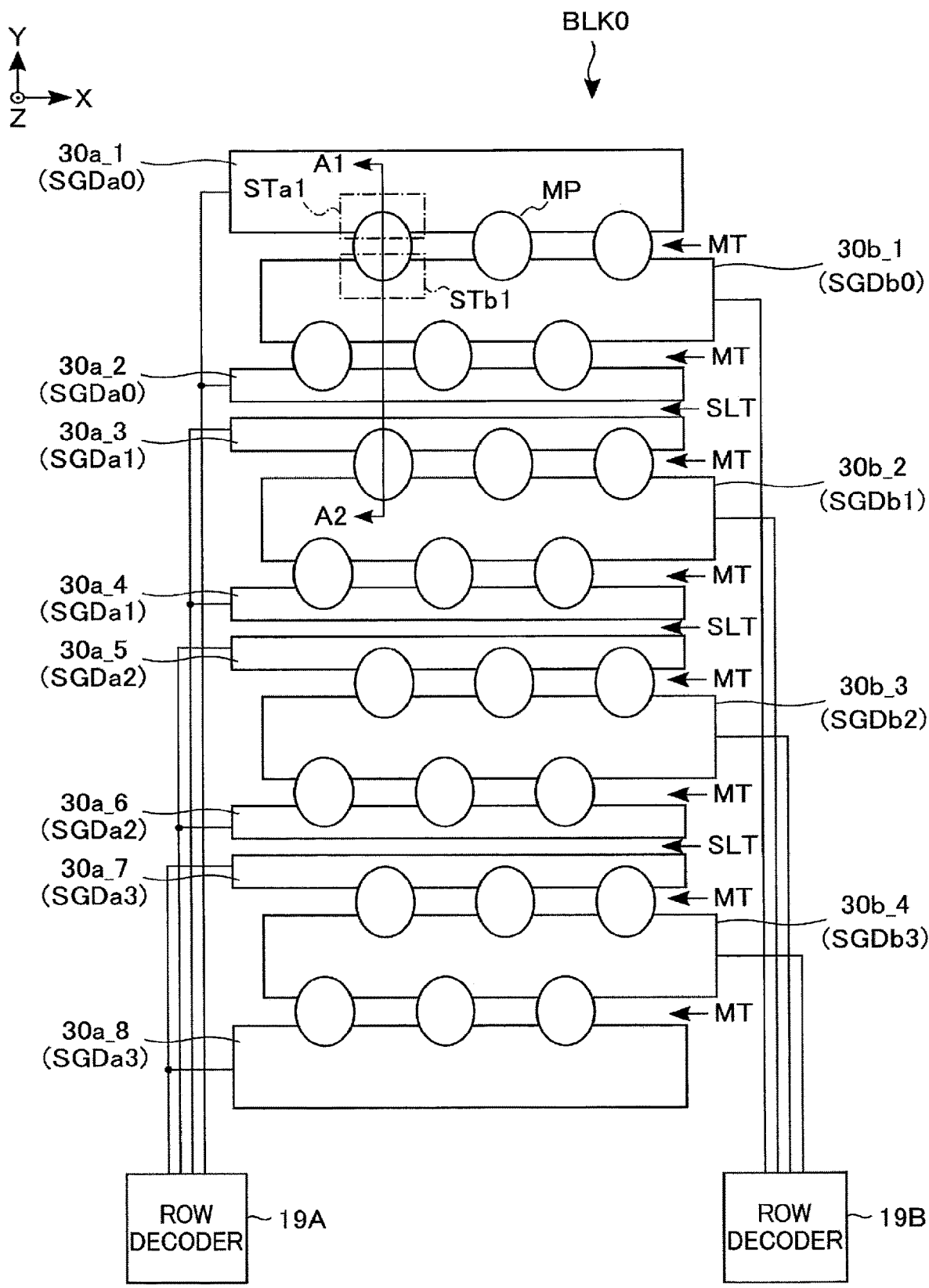
FIG. 4 is a top view of select gate lines SGD of the memory cell array of the semiconductor memory device according to the first embodiment.
Figure 5:
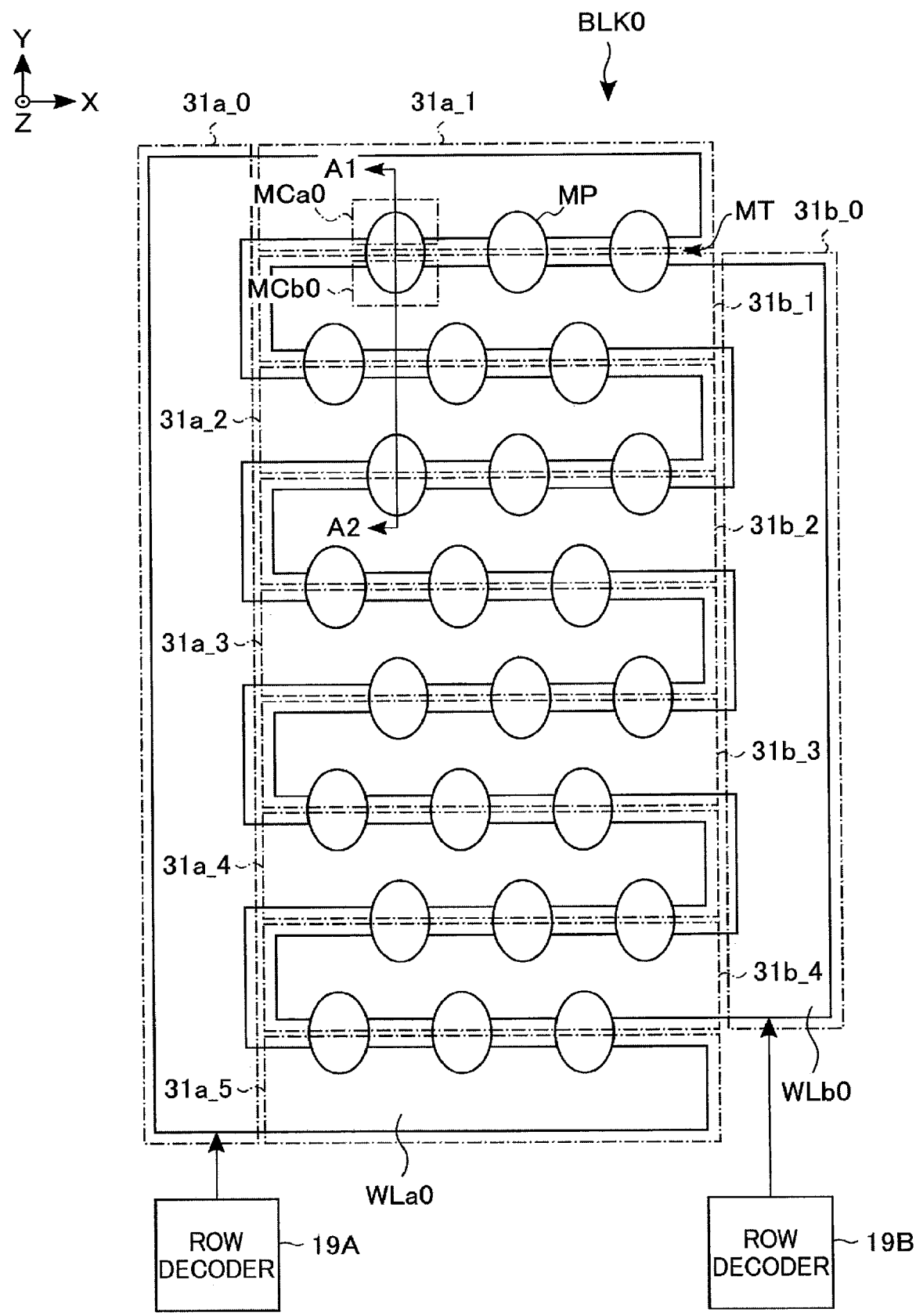
FIG. 5 is a top view of word lines WL0 of the memory cell array of the semiconductor memory device according to the first embodiment.

Next, the planar configuration of the memory cell array 18 will be described with reference to FIGS. 4 and 5. The example in FIG. 4 is a planar layout of the select gate lines SGD (SGDa0 to SGDa3 and SGDb0 to SGDb3) of the block BLK0 including the four string units SU0 to SU3. The example in FIG. 5 is a planar layout of the word lines WLa0 and WLb0 of the block BLK0. In addition, an insulating film is omitted in the examples in FIGS. 4 and 5.

As shown in FIG. 4, 12 interconnection layers $30a\_1$, $30b\_1$, $30a\_2$, $30a\_3$, $30b\_2$, $30a\_4$, $30a\_5$, $30b\_3$, $30a\_6$, $30a\_7$, $30b\_4$, and $30a\_8$ extending in an X direction parallel to the semiconductor substrate are aligned in order along a Y direction parallel to the semiconductor substrate and perpendicular to the X direction. The interconnection layers $30a\_1$, $30b\_1$, $30a\_2$, $30a\_3$, $30b\_2$, $30a\_4$, $30a\_5$, $30b\_3$, $30a\_6$, $30a\_7$, $30b\_4$, and $30a\_8$ will be referred to as interconnection layers 30 below unless respectively specified. Each interconnection layer 30 functions as the select gate line SGD. In the example in FIG. 4, the two interconnection layers $30a\_1$ and $30a\_2$ in the block BLK0 function as the select gate line SGDa0, and are coupled in common to the row decoder 19A. The interconnection layers $30a\_3$ and $30a\_4$ function as the select gate line SGDa1, and are coupled in common to the row decoder 19A. The interconnection layers $30a\_5$ and $30a\_6$ function as the select gate line SGDa2, and are coupled in common to the row decoder 19A. The interconnection layers $30a\_7$ and $30a\_8$ function as the select gate line SGDa3, and are coupled in common to the row decoder 19A. Furthermore, the interconnection layers $30b\_1$, $30b\_2$, $30b\_3$, and $30b\_4$ function as the select gate lines SGDb0 to SGDb3, respectively, and are respectively coupled to the row decoder 19B.

The interconnection layers 30 adjacent in the Y direction in the block BLK are insulated by the not-shown insulating film. A region of the insulating layer provided between an interconnection layer $30a$ and an interconnection layer $30b$ will be referred to as a memory trench MT. More specifically, the memory trenches MT are provided between the interconnection layers $30a\_1$ and $30b\_1$, between the interconnection layers $30b\_1$ and $30a\_2$, between the interconnection layers $30a\_3$ and $30b\_2$, between the interconnection layers $30b\_2$ and $30a\_4$, between the interconnection layers $30a\_5$ and $30b\_3$, between the interconnection layers $30b\_3$ and $30a\_6$, between the interconnection layers $30a\_7$ and $30b\_4$, and between the interconnection layers $30b\_4$ and 30a_8. The memory trenches MT are provided to isolate a plurality of not-shown word lines WL and the not-shown select gate lines SGS provided below the select gate lines SGD.

Furthermore, the region of the insulating layer provided between the two interconnection layers 30a will be referred to as a slit SLT. More specifically, the slits SLT are provided between the interconnection layers 30a_2 and 30a_3, between the interconnection layers 30a_4 and 30a_5, and between the interconnection layers 30a_6 and 30a_7. The slits SLT isolate the select gate lines SGD, and do not isolate the word lines WL and the select gate lines SGS provided below.

A plurality of memory pillars MP each extending in a Z direction vertical to the semiconductor substrate is disposed in, for example, a staggered arrangement between the interconnection layers 30a and 30b provided with the memory trench MT. The one memory pillar MP corresponds to the one memory string MSa and the one memory string MSb.

For example, in the memory pillar MP provided between the select gate line SGDa0 (interconnection layer 30a_1) and the select gate line SGDb0 (interconnection layer 30b_1), a region including part of the select gate line SGDa0 and part of the memory pillar MP in contact with the select gate line SGDa0 functions as the select transistor STa1 of the string unit SU0. Similarly, a region including part of the select gate line SGDb0 and part of the memory pillar MP in contact with the select gate line SGDb0 functions as the select transistor STb1 of the string unit SU0.

Next, a planar layout of the word lines WLa0 and WLb0 will be described. The word lines WLa0 and WLb0 are provided below the select gate line SGD in the Z direction.

As shown in FIG. 5, the word line WLa0 includes an interconnection layer 31a_0 extending in the Y direction, and five interconnection layers 31a_1 to 31a_5 extending in the X direction. The word line WLb0 includes an interconnection layer 31b_0 extending in the Y direction, and four interconnection layers 31b_1 to 31b_4 extending in the X direction. The interconnection layers 31a_0 to 31a_5 and 31b_0 to 31b_4 will be referred to as interconnection layers 31 below unless respectively specified.

The interconnection layers 31a_1, 31b_1, 31a_2, 31b_2, 31a_3, 31b_3, 31a_4, 31b_4, and 31a_5 are disposed in order between the interconnection layer 31a_0 and the interconnection layer 31b_0 along the Y direction. One ends of the interconnection layers 31a_1 to 31a_5 are coupled to the interconnection layer 31a_0, and one ends of the interconnection layers 31_b1 to 31b_4 are coupled to the interconnection layer 31b_0.

The interconnection layer 31a_1 is disposed below the interconnection layer 30a_1. The interconnection layer 31b_1 is disposed below the interconnection layer 30b_1. The interconnection layer 31a_2 is disposed below the interconnection layer 30a_2 and the interconnection layer 30a_3. The interconnection layer 31b_2 is disposed below the interconnection layer 30b_2. The interconnection layer 31a_3 is disposed below the interconnection layer 30a_4 and the interconnection layer 30a_5. The interconnection layer 31b_3 is disposed below the interconnection layer 30b_3. The interconnection layer 31a_4 is disposed below the interconnection layer 30a_6 and the interconnection layer 30a_7. The interconnection layer 31b_4 is disposed below the interconnection layer 30b_4. The interconnection layer 31a_5 is disposed below the interconnection layer 30a_8.

The word line WLa0 and the word line WLb0 are insulated from each other by the memory trench MT. Furthermore, a plurality of memory pillars MP described with reference to FIG. 4 is disposed between the word line WLa0 and the word line WLb0.

In the memory pillar MP provided between the word line WLa0 and the word line WLb0, a region including part of the word line WLa0 and part of the memory pillar MP in contact with the word line WLa0 functions as the memory cell transistor MCa0, i.e., one storage unit. Similarly, a region including part of the word line WLb0 corresponding to the word line WLa0 and part of the memory pillar MP in contact with the word line WLb0 functions as the memory cell transistor MCb0. That is, the two memory cell transistors MC corresponding to one memory pillar MP are provided in the same layer (layer) (such a structure will be referred to as a "twin cell structure" below).

The row decoder 19A is coupled to the word line WLa0, and the row decoder 19B is coupled to the word line WLb0.

The same is true of the other word lines WL and the select gate lines SGS, too.

1.1.5 Cross-Sectional Configuration of Memory Cell Array

Figure 6:
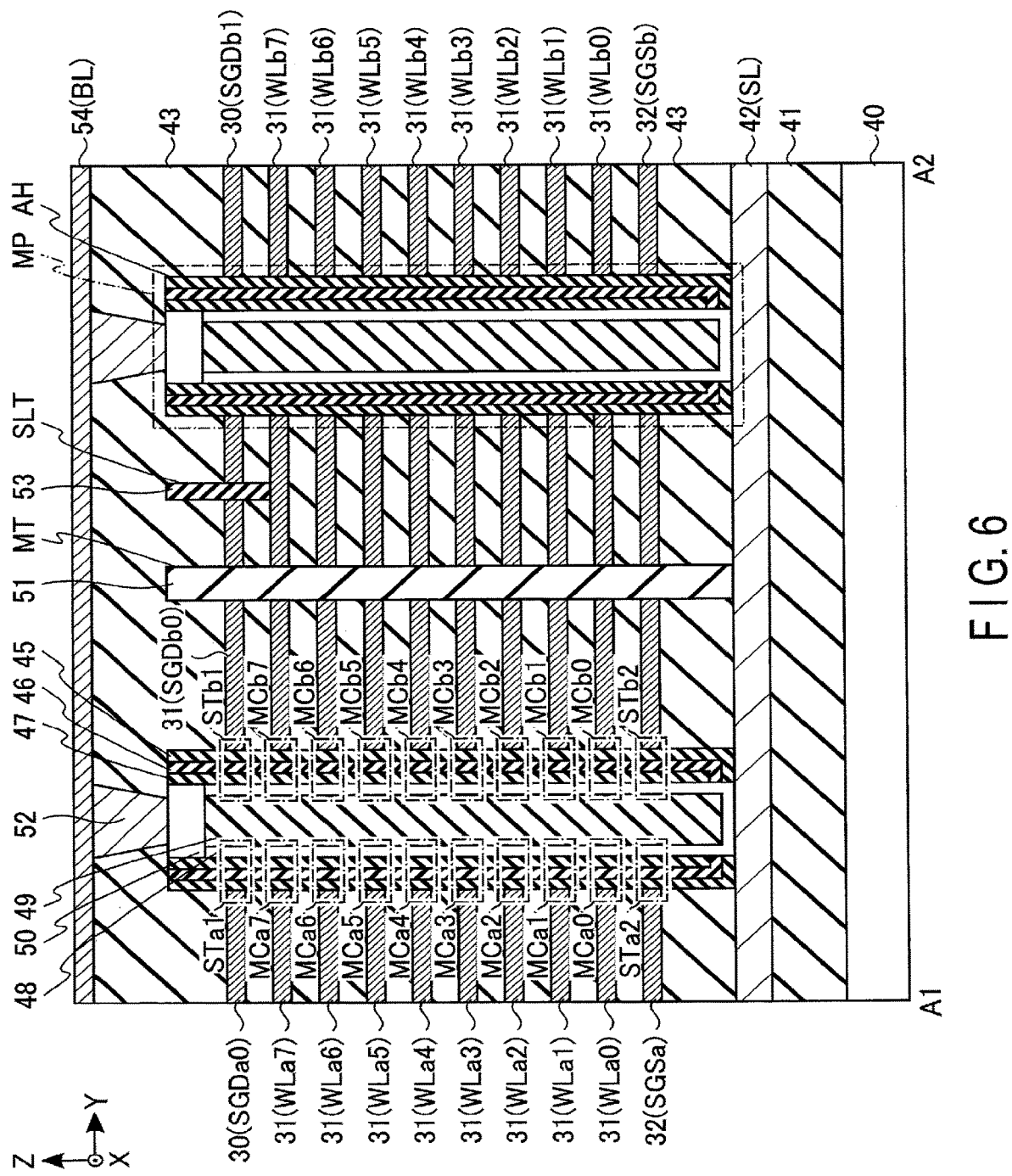
FIG. 6 is a cross-sectional view of the memory cell array of the semiconductor memory device according to the first embodiment.

Next, the cross-sectional configuration of the memory cell array 18 will be described with reference to FIG. 6. FIG. 6 is a cross-sectional view of the memory cell array 18 along an A1-A2 line in FIGS. 4 and 5.

As shown in FIG. 6, an insulating layer 41 is formed on a semiconductor substrate 40. For example, a silicon oxide film ($SiO_2$) is used for the insulating layer 41. In addition, a circuit such as the row decoders 19A and 19B or the sense amplifier 21 may be provided in a region in which the insulating layer 41 is formed, i.e., between the semiconductor substrate 40 and an interconnection layer 42.

The interconnection layer 42 which functions as the source line SL is formed on the insulating layer 41. The interconnection layer 42 is made of a conductive material, and an n-type semiconductor added with an impurity or a metallic material is used therefor. Furthermore, for example, the interconnection layer 42 may be a stacked structure of a semiconductor layer and a metal layer.

An insulating layer 43 is formed on the interconnection layer 42. The interconnection layers 32 which function as the select gate lines SGS, the eight interconnection layers 31 which function as word lines WL0 to WL7, and interconnection layers 30 which function as the select gate lines SGD are stacked on the insulating layer 43 in order so as to be apart from each other in the Z direction with a plurality of insulating layers 43 interposed therebetween. The insulating layer 43 is further stacked on the interconnection layer 30.

For example, $SiO_2$ is used for the insulating layer 43. The interconnection layers 30 to 32 are made of a conductive material, and an n-type semiconductor or a p-type semiconductor added with an impurity or a metallic material is used therefor. For example, a stacked structure of titanium nitride (TiN)/tungsten (W) is used as the interconnection layers 30 to 32. TiN functions as a barrier layer for suppressing a reaction of W and $SiO_2$ or an adhesive layer for improving adhesion of W when W is deposited by, for example, CVD (chemical vapor deposition).

The memory trench MT penetrating the interconnection layers 30 to 32 and extending in the X direction such that a bottom surface is in contact with the interconnection layer 42 is formed. The memory trench MT isolates the interconnection layers 30 to 32 provided between the two memory pillars MP in the Y direction. An insulating layer 51 is filled in the memory trench MT. For example, $SiO_2$ is used for the insulating layer 51.

The slit SLT penetrating the interconnection layer 30 which functions as the select gate line SGD and extending in the X direction so as to come into contact with the interconnection layer 31 whose bottom surface functions as the word line WL7 is formed. That is, the slit SLT isolates the interconnection layer 30 which functions as the select gate line SGD in the Y direction. An insulating layer 53 is filled in the slit SLT. For example, $SiO_2$ is used for the insulating layer 53.

A plurality of memory pillars MP and the memory trenches MT are alternately disposed in the Y direction. The memory pillar MP includes a block insulating film 45, a charge storage layer 46, a tunnel insulating film 47, a semiconductor layer (or also referred to as a semiconductor pillar) 48, a core layer 49, and a cap layer 50.

More specifically, a hole AH which penetrates the interconnection layers 30 to 32 and the insulating layers 43, and meets the memory pillar MP such that the bottom surface reaches the interconnection layer 42 is formed. The block insulating film 45, the charge storage layer 46, and the tunnel insulating film 47 are stacked in order on a side surface of the hole AH. Furthermore, the semiconductor layer 48 is formed such that the side surface is in contact with the tunnel insulating film 47 and the bottom surface is in contact with the interconnection layer 42. The semiconductor layer 48 is a region in which channels of the memory cell transistor MC and the select transistors ST1 and ST2 are formed. Hence, the semiconductor layer 48 functions as a signal line which couples current paths of the select transistor ST2, the memory cell transistors MC0 to MC7, and the select transistor ST1. The core layer 49 is provided in the semiconductor layer 48. Furthermore, the cap layer 50 whose side surface is in contact with the tunnel insulating film 47 is formed on the semiconductor layer 48 and the core layer 49.

For example, $SiO_2$ is used for the block insulating film 45, the tunnel insulating film 47, and the core layer 49. For example, a silicon nitride film (SiN) is used for the charge storage layer 46. For example, polysilicon is used for the semiconductor layer 48 and the cap layer 50.

A contact plug 52 is formed on the cap layer 50, and an interconnection layer 54 which functions as the bit line BL is provided on the contact plug 52. The contact plug 52 and the interconnection layer 54 are formed by a conductive material, and, for example, a stacked structure of titanium (Ti)/TiN/W is used.

In the example in FIG. 6, the interconnection layer 32 in contact with the left side in FIG. 6 of the memory pillar MP functions as the select gate line SGSa, the eight interconnection layers 31 function as the word lines WLa0 to WLa7, and the interconnection layer 30 functions as the select gate line SGDa. Similarly, the interconnection layer 32 in contact with the right side in FIG. 6 of the memory pillar MP functions as the select gate line SGSb, the eight interconnection layers 31 function as the word lines WLb0 to WLb7, and the interconnection layer 30 functions as the select gate line SGDb.

Hence, the memory pillar MP and the eight interconnection layers 31 which function as the word lines WLa0 to WLa7 provided on the left side in FIG. 6 of the memory pillar MP form each of the memory cell transistors MCa0 to MCa7. More specifically, the semiconductor layer 48, the eight interconnection layers 31 provided on the left side in FIG. 6 of the memory pillar MP, and the block insulating film 45, the charge storage layer 46, and the tunnel insulating film 47 included in a left half in FIG. 6 of the memory pillar MP provided between the semiconductor layer 48 and the eight interconnection layers 31 form each of the memory cell transistors MCa0 to MCa7. The memory pillar MP and the interconnection layer 32 which functions as the select gate line SGSa provided on the left side in FIG. 6 of the memory pillar MP form the select transistor STa2. The memory pillar MP and the interconnection layer 30 which functions as the select gate line SGDa provided on the left side in FIG. 6 of the memory pillar MP form the select transistor STa1.

Similarly, the memory pillar MP and the eight interconnection layers 31 which function as the word lines WLb0 to WLb7 provided on the right side in FIG. 6 of the memory pillar MP form each of the memory cell transistors MCb0 to MCb7. More specifically, the semiconductor layer 48, the eight interconnection layers 31 provided on the right side in FIG. 6 of the memory pillar MP, and the block insulating film 45, the charge storage layer 46, and the tunnel insulating film 47 included in a right half in FIG. 6 of the memory pillar MP provided between the semiconductor layer 48 and the eight interconnection layers 31 form each of the memory cell transistors MCb0 to MCb7. The memory pillar MP and the interconnection layer 32 which functions as the select gate line SGSb provided on the right side in FIG. 6 of the memory pillar MP form the select transistor STb2. The memory pillar MP and the interconnection layer 30 which functions as the select gate line SGDb provided on the right side in FIG. 6 of the memory pillar MP form the select transistor STb1.

1.2. Normal Mode and Bundle Mode

Next, the normal mode and the bundle mode will be described with reference to FIGS. 7 and 8. Examples in FIGS. 7 and 8 are a planar layout of the word lines WLa0 and WLb0 of the block BLK0.

In the present embodiment, when the write operation and the read operation are executed, one of the normal mode and the bundle mode is selected per block BLK.

Figure 7:
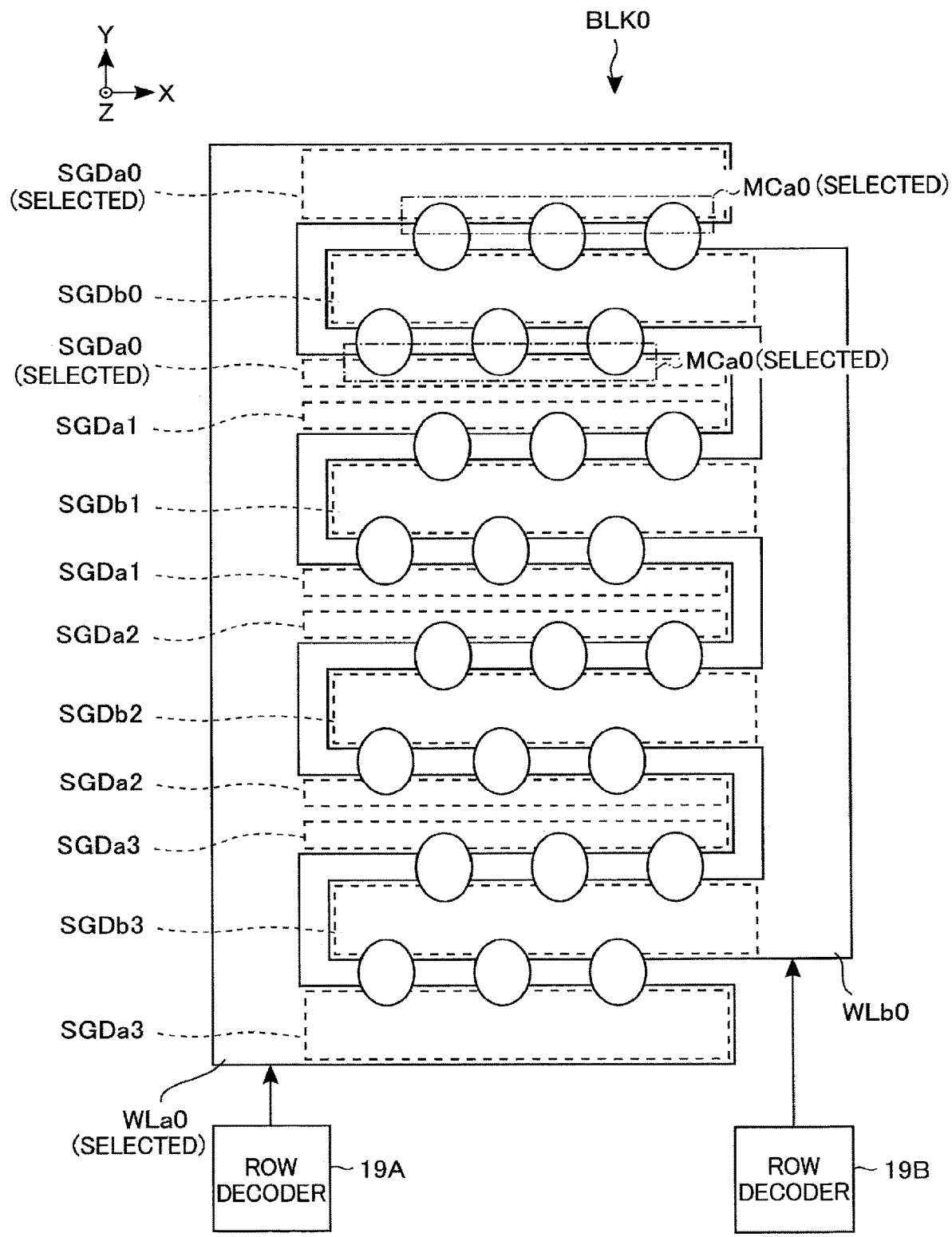
FIG. 7 is a top view of word lines showing a normal mode of the semiconductor memory device according to the first embodiment.

As shown in FIG. 7, the normal mode is the operation mode which selects one of the word line WLa and WLb provided in the same layer and one of the select gate lines SGDa and SGDb of the selected string unit SU, in the selected block BLK, and executes the write operation or the read operation. That is, the normal mode is the operation mode which selects one of the memory cell transistors MCa and MCb in the twin cell structure. In the example in FIG. 7, the word line WLa0 of the selected block BLK0 is selected, and the word line WLb0 is unselected. Furthermore, the select gate line SGDa0 of the string unit SU0 is selected. In this case, the memory cell transistor MCa0 is selected and the memory cell transistor MCb0 is unselected in the selected string unit SU0. Furthermore, the memory cell transistors MCa0 and MCb0 are respectively unselected in the unselected string units SU1 to SU3.

Figure 8:
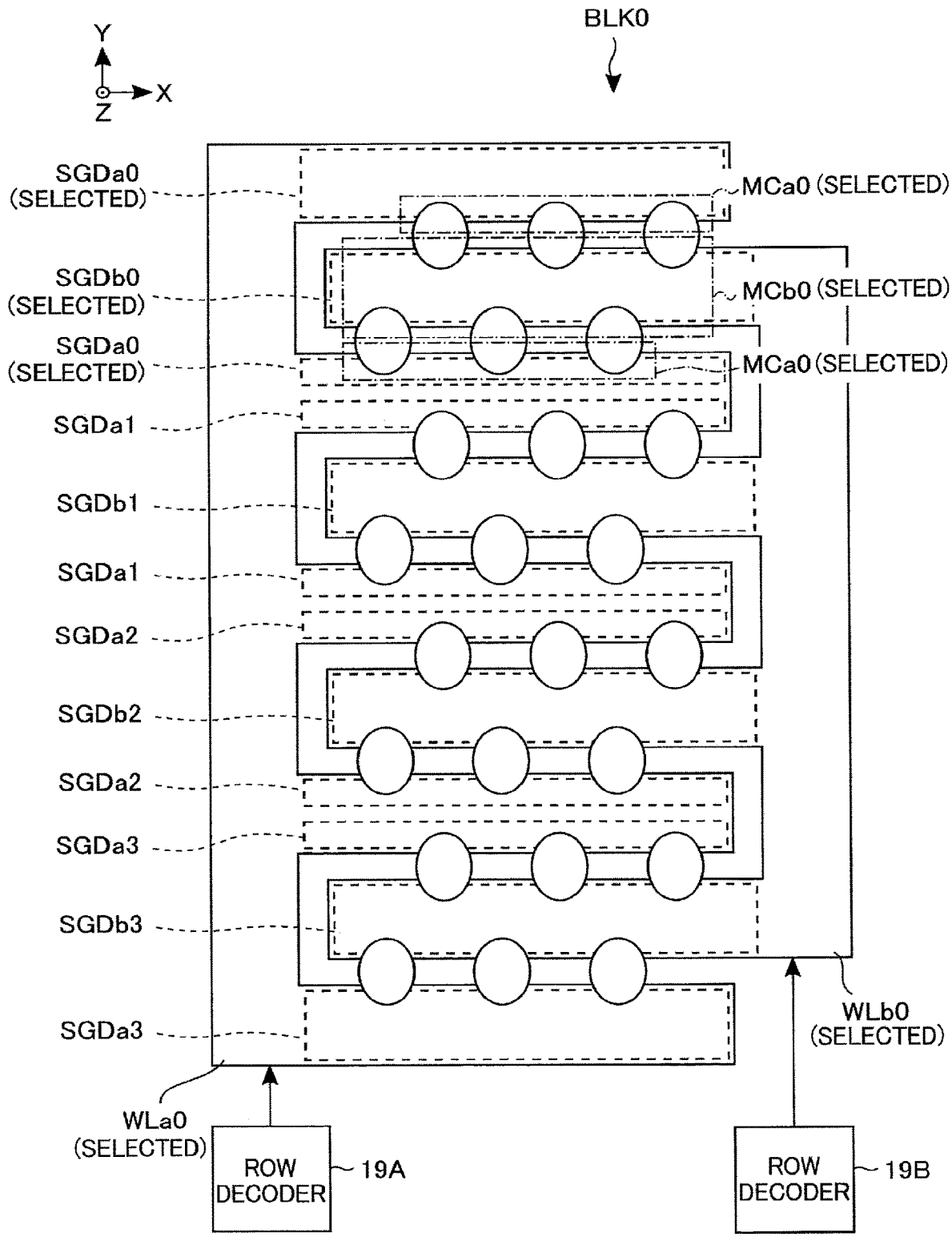
FIG. 8 is a top view of word lines showing a bundle mode of the semiconductor memory device according to the first embodiment.

As shown in FIG. 8, the bundle mode is the operation mode which selects both of the word line WLa and WLb provided in the same layer and both of the select gate lines SGDa and SGDb of the selected string unit SU, in the selected block BLK, and executes the write operation or the read operation. That is, the bundle mode is the operation mode which selects both of the memory cell transistors MCa and MCb in the twin cell structure. In the example in FIG. 8, the word lines WLa0 and WLb0 of the selected block BLK0 are selected. Furthermore, the select gate lines SGDa0 and SGDb0 of the string unit SU0 are selected. In this case, the memory cell transistors MCa0 and MCb0 are selected in the selected string unit SU0. Furthermore, the memory cell transistors MCa0 and MCb0 are respectively unselected in the unselected string units SU1 to SU3.

For example, the one block BLK is assumed to include a number of the memory cell transistors MC matching data of 2N bytes (N is an integer equal to or more than one). Then, the block BLK which supports the normal mode can hold the data of 2N bytes, and the block BLK which supports the bundle mode can hold data of N bytes since 1-bit data is stored for the two memory cell transistors MC.

1.3 Write Operation

Next, the write operation will be described. The write operation roughly includes a program operation and a program verify operation. Furthermore, by repeating a combination of the program operation and the program verify operation (referred to as a "program loop" below), a threshold voltage of the memory cell transistor MC is raised to a target level.

The program operation is an operation of raising the threshold voltage by injecting electrons in the charge storage layer 46 (or by inhibiting injection and thereby maintaining the threshold voltage). The operation of raising the threshold voltage will be referred to as a "0" program" below, and the bit line BL which is the "0" program target is applied a voltage (e.g., voltage VSS) corresponding to the "0" program from the sense amplifier 21. On the other hand, the operation of maintaining the threshold voltage will be referred to as a ""1" program" or "write inhibit", and the bit line BL which is the "1" program target is applied a voltage (referred to as a "voltage VBL" below) corresponding to the "1" program from the sense amplifier 21. The bit line corresponding to the "0" program will be referred to as BL ("0"), and the bit line corresponding to the "1" program will be referred to as BL ("1") below.

The program verify operation is an operation of reading data after the program operation, and determining whether or not the threshold voltage of the memory cell transistor MC reached a target level which is a target. A case where the threshold voltage of the memory cell transistor MC reaches the target level will be referred to as "verification is passed", and a case where the threshold voltage does not reach the target level will be referred to as "verification is failed" below.

In addition, the present embodiment will describe a case where the memory cell transistor MC can hold binary (one bit) data. However, the memory cell transistor MC may be able to hold quaternary (two bit) data or more.

1.3.1 Entire Flow of Write Operation

First, the entire flow of the write operation will be described with reference to FIG. 9.

As shown in FIG. 9, the host device 2 transmits a write request to the controller 200 (step S10).

When receiving the write request from the host device 2, the processor 230 selects the operation mode (step S11). More specifically, the processor 230 allocates a physical address (block BLK) of the memory 100 according to a logical address received from the host device 2. In this case, when the allocated physical address (block BLK) supports the normal mode based on block address information, the processor 230 selects the normal mode. On the other hand, when the allocated physical address supports the bundle mode, the processor 230 selects the bundle mode.

When selecting the normal mode (step S12_Yes), the processor 230 issues a write instruction (including a command, a physical address, and data) corresponding to the normal mode, and transmits the write instruction to the memory 100 (step S13).

The sequencer 15 executes the write operation in the normal mode according to the received write instruction (step S14).

On the other hand, when selecting the bundle mode (step S12_No), the processor 230 issues the write instruction corresponding to the bundle mode, and transmits the write instruction to the memory 100 (step S15).

The sequencer 15 executes the write operation in the bundle mode according to the received write instruction (step S16).

1.3.2 Command Sequence During Write Operation

Figure 10:
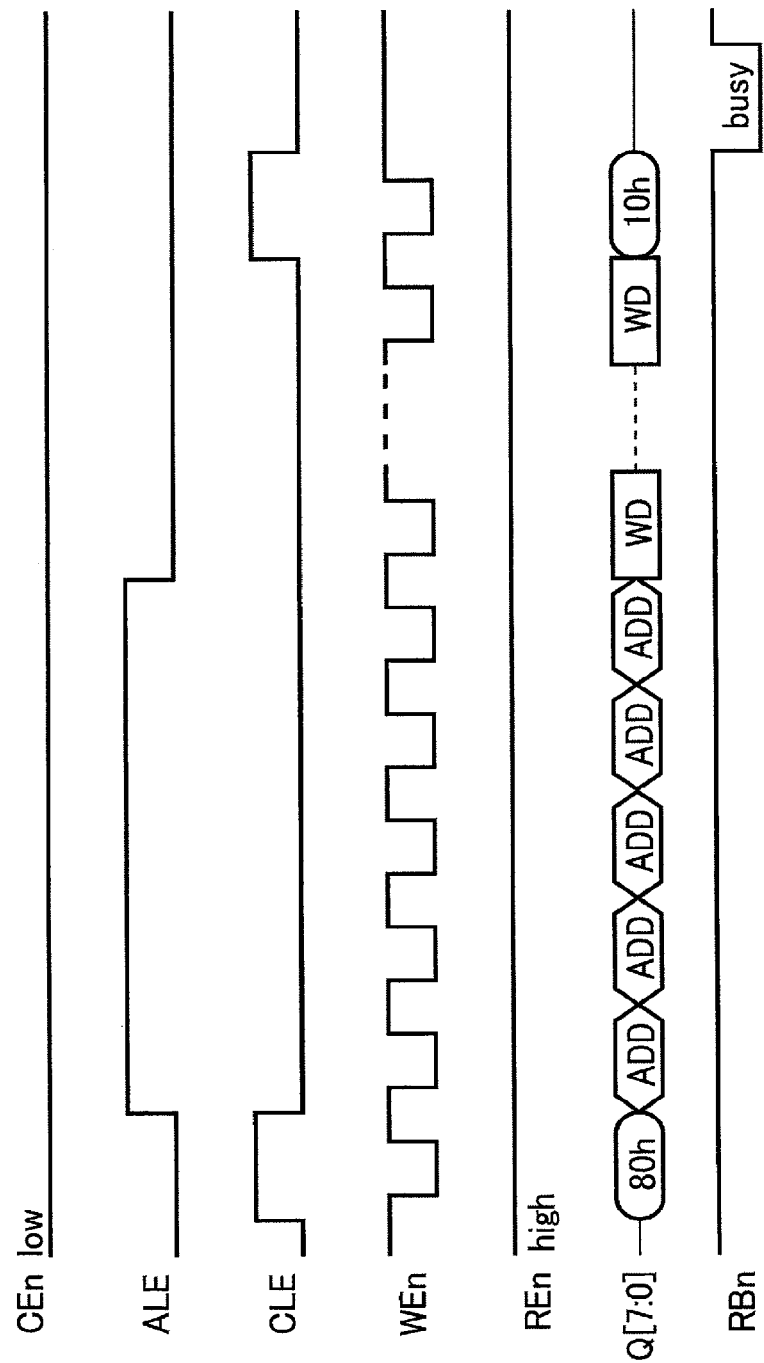
FIG. 10 is a command sequence of the write operation in a normal mode of the memory system according to the first embodiment.
Figure 11:
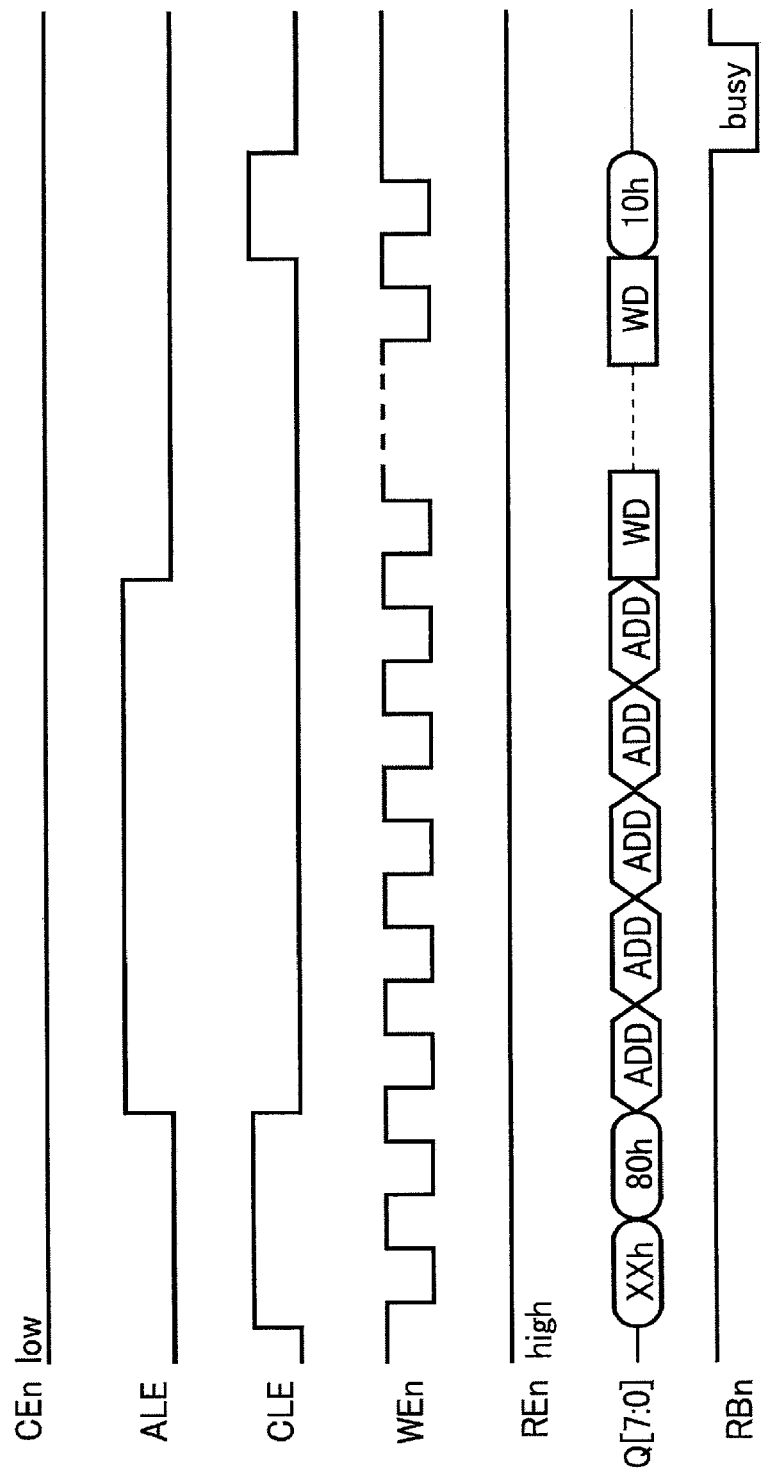
FIG. 11 is a command sequence of the write operation in a bundle mode of the memory system according to the first embodiment.

Next, the command sequence during the write operation will be described with reference to FIGS. 10 and 11. FIG. 10 shows the command sequence of the normal mode, and FIG. 11 shows the command sequence of the bundle mode.

As shown in FIG. 10, the processor 230 first outputs a command "80h" for providing notification of execution of the write operation to the memory 100, and asserts the command latch enable signal CLE at the "H" level.

Next, the processor 230 outputs the address "ADD", and asserts the address latch enable signal ALE at the "H" level. In addition, the example in FIG. 10 shows five cycles of the address. However, the number of cycles is optional.

Next, the processor 230 outputs the necessary number of cycles of the write data "WD".

Next, the processor 230 outputs a command "10h" for giving an instruction of execution of write operation, and asserts the command latch enable signal CLE at the "H" level.

In response to the command "10h", the memory 100 starts the write operation in the normal mode, and enters a busy state (RBn="L").

When the write operation is finished, the memory 100 enters a ready state, and recovers the ready/busy signal RBn to the "H" level.

Next, the command sequence of the bundle mode will be described. Differences from those of FIG. 10 will be mainly described below.

As shown in FIG. 11, the processor 230 first outputs a prefix command "XXh" for giving an instruction of the bundle mode of the write operation to the memory 100, and asserts the command latch enable signal CLE at the "H" level. The subsequent operation of the processor 230 is the same as that of the command sequence in FIG. 10.

In response to the commands "XXh" and "10h", the memory 100 starts the write operation in the bundle mode, and enters a busy state (RBn="L").

When the write operation is finished, the memory 100 enters the ready state, and recovers the ready/busy signal RBn to the "H" level.

1.3.3 Write Operation of Memory

Next, the write operation of the memory 100 will be described with reference to FIG. 12.

Figure 12:
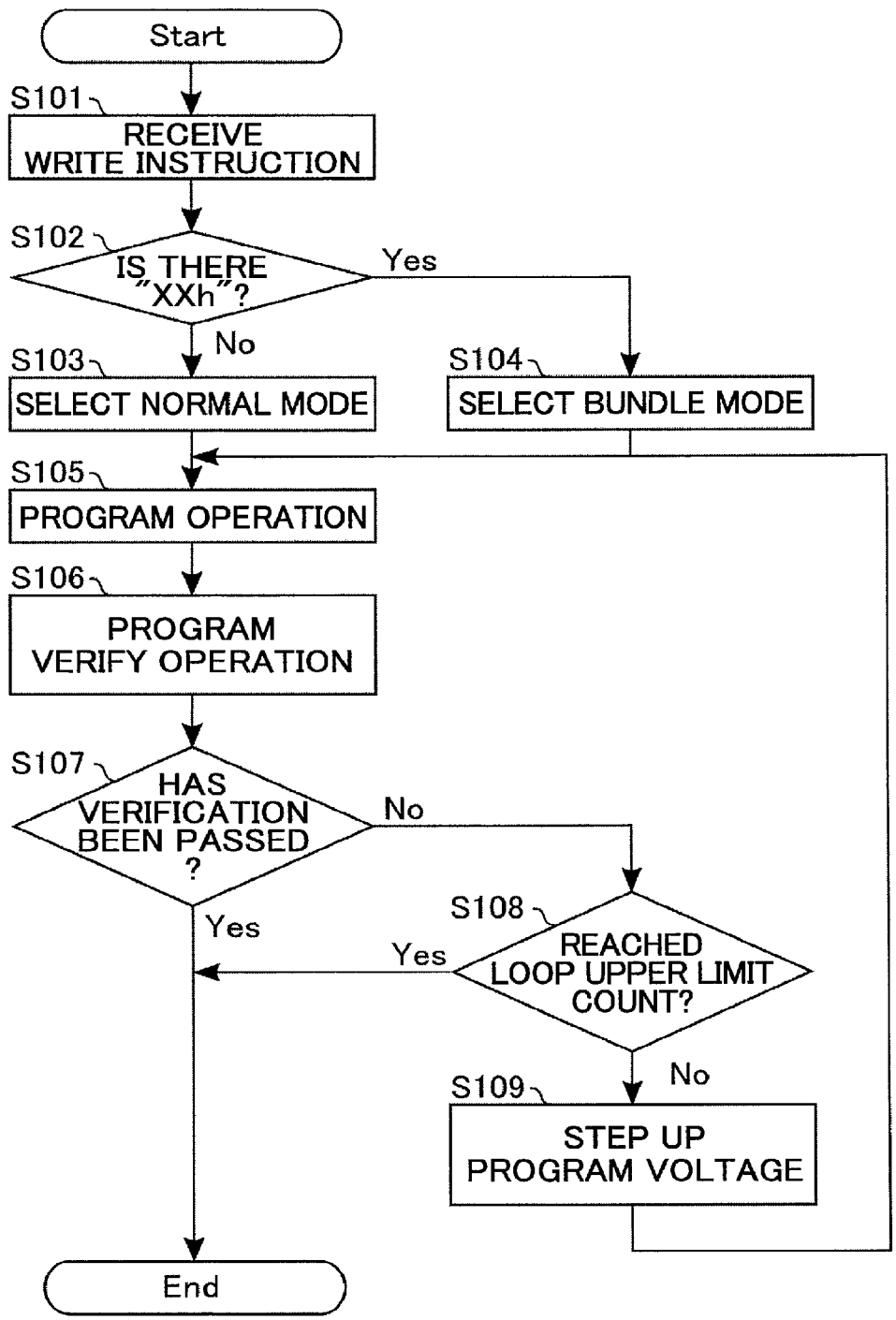
FIG. 12 is a flowchart of the write operation of the semiconductor memory device according to the first embodiment.

As shown in FIG. 12, the memory 100 first receives the write instruction from the controller 200 (step S101).

When the prefix command "XXh" is not received (step S102_No), i.e., when the write instruction of the normal mode is received, the sequencer 15 selects the normal mode (step S103).

When the prefix command "XXh" is received (step S102_Yes), i.e., when the write instruction of the bundle mode is received, the sequencer 15 selects the bundle mode (step S104).

Next, the sequencer 15 executes the program operation (step S105). When the normal mode is selected, the row decoders 19A and 19B apply program voltages to one of the word line WLa0 to WLa7 and WLb0 to WLb7 of the selected block BLK. Furthermore, when the bundle mode is selected, the row decoders 19A and 19B apply program voltages to one of the word line WLa0 to WLa7 of the selected block BLK, and one of the word lines WLb0 to WLb7 provided in the same layer. More specifically, in, for example, the bundle mode, the row decoders 19A and 19B apply the program voltages to the word lines WLa0 and WLb0 of the selected block BLK.

After the program operation, the sequencer 15 executes the program verify operation (step S106).

When the verification has been failed (step S107_No), the sequencer 15 checks whether or not a program loop count reached a preset upper limit count (step S108).

When the program loop count reached the upper limit count (step S108_Yes), the sequencer 15 finishes the write operation, and reports to the controller 200 that the write operation was not normally finished.

When the program loop count does not reach the upper limit count (step S108_No), the sequencer 15 steps up a set voltage value of the program voltage, and returns to step S105.

Furthermore, when the verification has been passed (step S107_Yes), the sequencer 15 finishes the write operation.

1.3.4 Voltage of Each Interconnection During Write Operation

Figure 13:
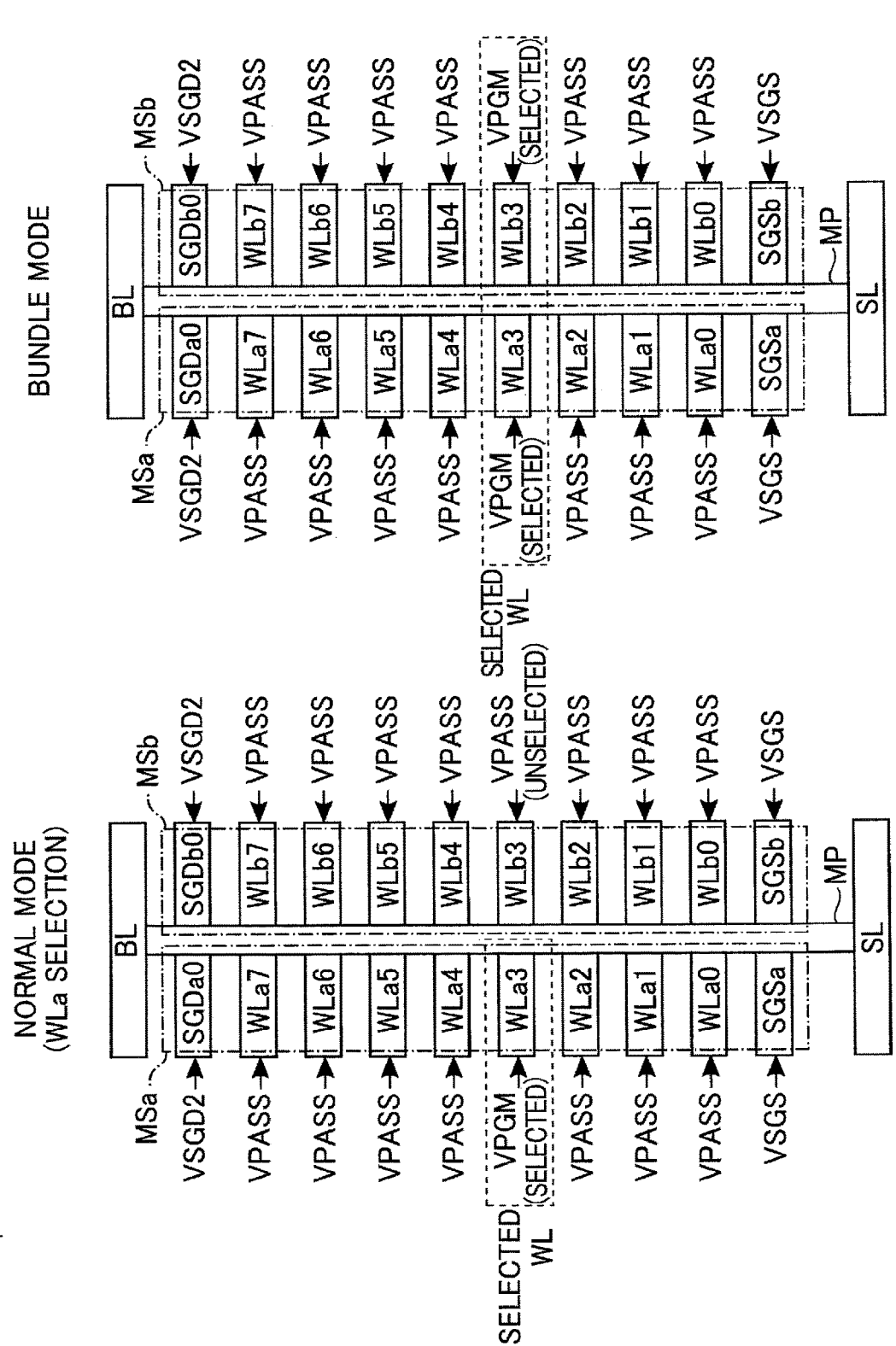
FIG. 13 is a view showing one example of a voltage of each interconnection in the write operation of the semiconductor memory device according to the first embodiment.

Next, the voltage of each interconnection during the write operation will be described with reference to FIGS. 13 and 14. FIG. 13 shows one example of the voltage applied to each interconnection during the write operation, and FIG. 14 shows a timing chart showing the voltage of each interconnection. An example of FIG. 13 shows a case that, in the normal mode, the word line WLa3 of the string unit SU0 is selected and, in the bundle mode, the word lines WLa3 and WLb3 of the string unit SU0 are selected. In addition, the same is true of the case where the other word lines WL are selected.

As shown in FIG. 13, it is assumed that, the word line WLa3 is selected in the normal mode. That is, for example, the memory string MSa of the selected string unit SU0 is selected, and the memory string MSb is unselected. In this case, the row decoder 19A respectively applies a program voltage VPGM to the selected word line WLa3 in the select memory string MSa, and applies a voltage VPASS to the unselected word lines WLa0 to WLa2 and WLa4 to WLa7. The voltage VPGM is a high voltage for injecting electrons in the charge storage layer 46. The voltage VPASS is a voltage which turns the memory cell transistor MC into an on state irrespectively of the threshold voltage of the memory cell transistor MC. The voltage VPGM and the voltage VPASS have a relationship of VPGM>VPASS.

When the word line WLb3 provided in the same layer as the word line WLa3 in the unselect memory string MSb is unselected like the other word lines WLb0 to WLb2 and WLb4 to WLb7. The row decoder 19B applies the voltage VPASS to the word lines WLb0 to WLb7.

Furthermore, the row decoders 19A and 19B apply, for example, voltages VSGD2 to the select gate lines SGDa0 and SGDb0, respectively. The voltage VSGD2 is a voltage which turns the select transistor STa1 corresponding to the bit line BL ("1") into a cutoff state, and turns the select transistor STa1 corresponding to the bit line BL ("0") into an on state. Furthermore, the row decoders 19A and 19B apply, for example, voltages VSGS to the select gate lines SGSa and SGSb, respectively. The voltage VSGS is a voltage which turns the select transistors STa2 and STb2 into a cutoff state.

Next, the bundle mode will be described.

It is assumed that, in the bundle mode, the word lines WLa3 and WLb3 are selected. That is, for example, the memory strings MSa and MSb of the selected string unit SU0 are selected. In this case, the row decoders 19A and 19B apply the program voltages VPGM to the selected word lines WLa3 and WLb3, respectively.

Furthermore, the row decoder 19A applies the voltage VPASS to each of the unselected word lines WLa0 to WLa2 and WLa4 to WLa7. The row decoder 19B applies the voltage VPASS to each of the unselected word lines WLb0 to WLb2 and WLb4 to WLb7.

Furthermore, similarly to the normal mode, the row decoders 19A and 19B apply, for example, the voltages VSGD2 to the select gate lines SGDa0 and SGDb0, respectively. Furthermore, the row decoders 19A and 19B apply, for example, the voltages VSGS to the select gate lines SGSa and SGSb, respectively.

Next, the voltage of each interconnection will be described in detail.

As shown in FIG. 14, at a time to, the sense amplifier 21 applies the voltage VSS to the bit line BL ("0") and applies the voltage VBL to the bit line BL ("1"). The row decoders 19A and 19B apply voltages VSGD1 to the select gate lines SGDa0 and SGDb0 corresponding to the selection string unit SU0, and apply the voltages VSS to the select gate lines SGDa1 to SGDa3 and SGDb1 to SGDb3 corresponding to the unselected string units SU1 to SU3. The voltage VSGD1 is a voltage which turns the select transistor ST1 into the on state irrespectively of the voltage of the bit line BL. Thus, the select transistors STa1 and STb1 of the selected string unit SU0 are turned into the on state, and the select transistors STa1 and STb1 of the unselected string units SU1 to SU3 are turned into the off state.

Furthermore, the row decoders 19A and 19B apply, for example, the voltages VSGS to the select gate lines SGS (SGSa and SGSb). A voltage VSL is applied to the source line SL. The voltage VSL is a voltage higher than the voltage VSGS. Thus, the select transistors STa2 and STb2 of the string units SU0 to SU3 are turned into the off state.

At a time t1, the row decoders 19A and 19B apply the voltages VSGD2 to the select gate lines SGDa0 and SGDb0 corresponding to the selected string unit SU0. Thus, the select transistors STa1 and STb1 corresponding to the bit line BL ("1") are turned into the cutoff state, and the channels of the memory strings MSa and MSb are turned into a floating state.

At a time t2, the row decoders 19A and 19B apply the voltages VPASS to the word lines WL (WLa0 to WLa7 and WLb0 to WLb7). Thus, the voltages of the channels of the memory strings MSa and MSb corresponding to the bit line BL ("1") in the floating state are raised by coupling with the word line WL.

At a time t3, the row decoder 19A and/or 19B applies the voltage VPGM to the selected word line WL. More specifically, in a case of, for example, the normal mode, the row decoder 19A applies the voltage VPGM to, for example, the selected word line WLa3. Furthermore, in a case of, for example, the bundle mode, the row decoders 19A and 19B apply the voltages VPGM to the selected word lines WLa3 and WLb3. Thus, charges are injected in the charge storage layer in the memory cell transistor MC which is coupled to the selected word line WL and writes "0" data. On the other hand, in the memory cell transistor MC which is coupled to the selected word line WL and writes "1" data, coupling by the voltage VPGM raises the voltage of the channel, and therefore charges are hardly injected in the charge storage layer.

At a time t4, the row decoder 19A and/or 19B applies the voltage VPASS to the selected word line WL.

Subsequently, at times t5 to t6, a recovery operation is performed, and the voltage of each interconnection is reset.

1.4 Read Operation.

Next, the read operation will be described.

1.4.1 Entire Flow of Read Operation

First, the entire flow of the read operation will be described with reference to FIG. 15.

Figure 15:
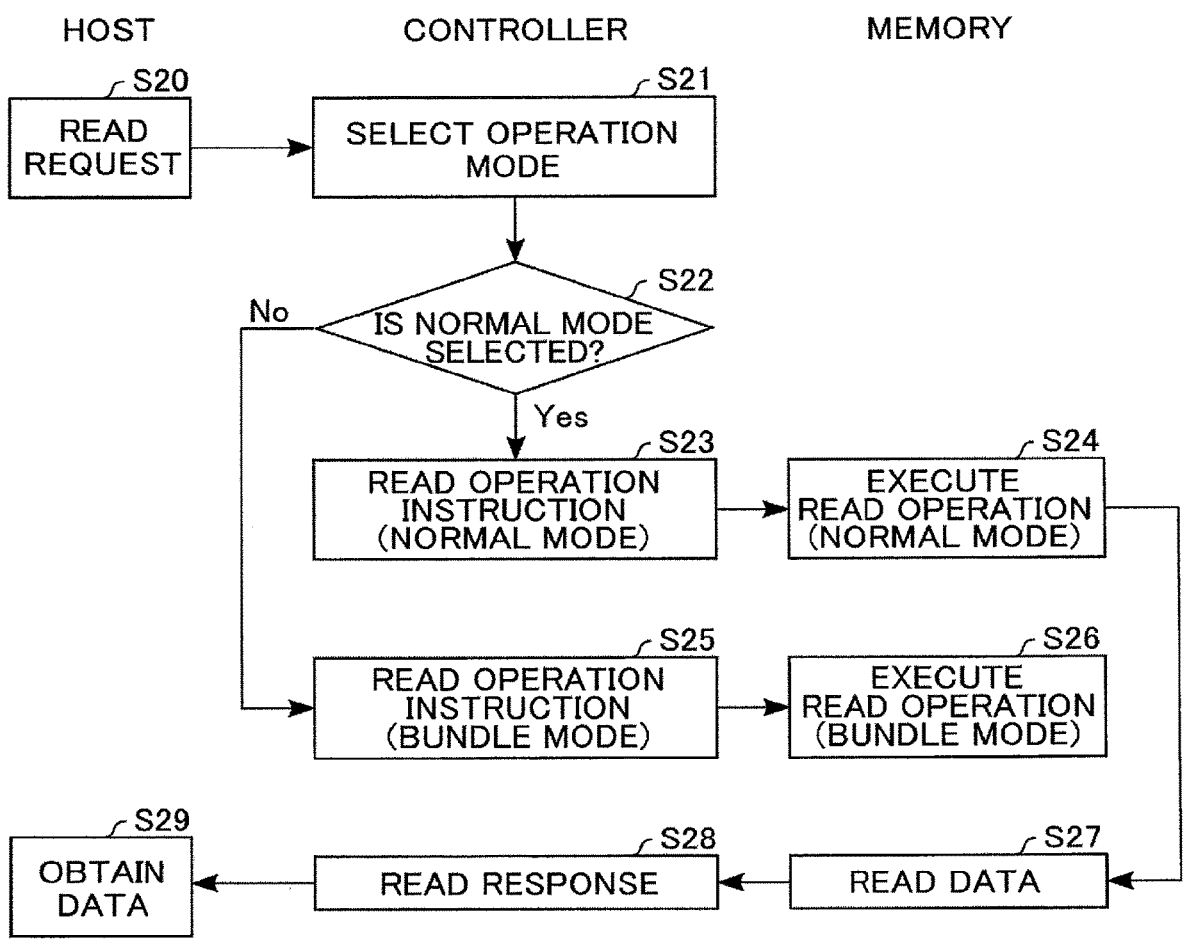
FIG. 15 is a flowchart showing an entire flow of a read operation of the memory system according to the first embodiment.

As shown in FIG. 15, the host device 2 transmits a read request to the controller 200 (step S20).

When receiving the read request from the host device 2, the processor 230 selects the operation mode (step S21). More specifically, the processor 230 checks the physical address (block BLK) of the memory 100 corresponding to the logical address received from the host device 2, and, when the selected physical address selected based on the block address information supports the normal mode, the processor 230 selects the normal mode. On the other hand, when the selected physical address supports the bundle mode, the processor 230 selects the bundle mode.

When selecting the normal mode (step 322_Yes), the processor 230 issues a read instruction (including a command and a physical address) corresponding to the normal mode, and transmits the read instruction to the memory 100 (step S23).

The sequencer 15 executes the read operation in the normal mode according to the received read instruction (step S24).

On the other hand, when selecting the bundle mode (step S22_No), the processor 230 issues the read instruction corresponding to the bundle mode, and transmits the read instruction to the memory 100 (step S25).

The sequencer 15 executes the read operation in the bundle mode according to the received read instruction (step S26).

When finishing the read operation, the sequencer 15 transmits read data to the controller 200 (step S27).

After performing ECC processing on the read data received from the memory 100, the processor 230 transmits error-corrected read data to the host device 2 as a read response to the read request (step S28).

The host device 2 obtains data (step S29), and finishes the read operation.

1.4.2 Command Sequence During Read Operation

Figure 17:
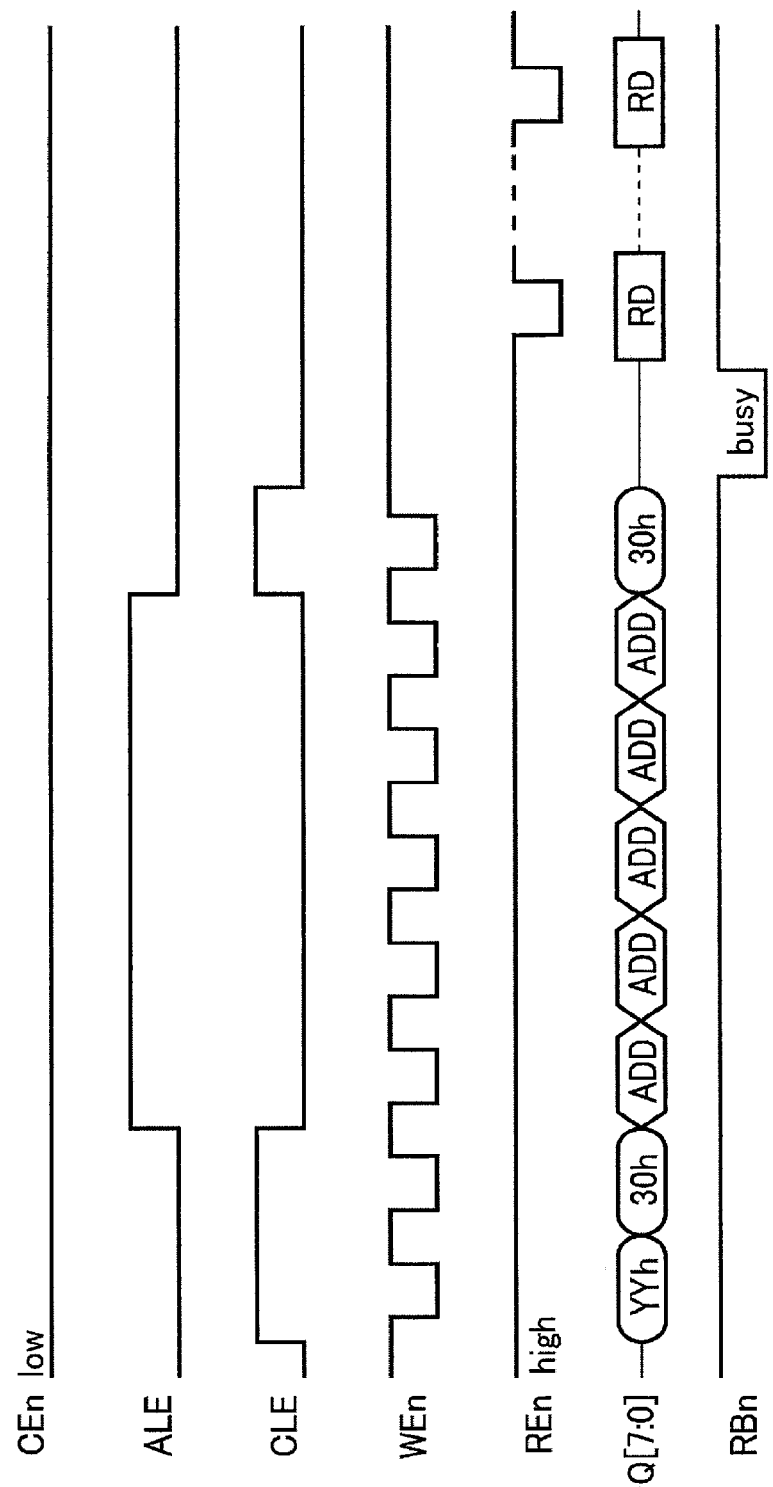
FIG. 17 is a command sequence of the read operation in the bundle mode of the memory system according to the first embodiment.

Next, the command sequence corresponding to the read operation will be described with reference to FIGS. 16 and 17. FIG. 16 shows the command sequence of the normal mode, and FIG. 17 shows the command sequence of the bundle mode.

As shown in FIG. 16, the processor 230 first outputs a command "00h" for providing notification of execution of the read operation to the memory 100, and asserts the command latch enable signal CLE at the "H" level.

Next, the processor 230 outputs the address "ADD", and asserts the address latch enable signal ALE at the "H" level. In addition, the example in FIG. 16 shows five cycles of the address. However, the number of cycles is optional.

Next, the processor 230 outputs a command "30h" for giving an instruction of execution of reading, and asserts the command latch enable signal CLE at the "H" level.

In response to the command "30h", the memory 100 starts the read operation in the normal mode, and enters a busy state (RBn="L").

When the read operation is finished, the memory 100 enters a ready state, and recovers the ready/busy signal RBn to the "H" level.

When receiving the ready/busy signal RBn of the "H" level, the processor 230 toggles the read enable signal REn, and reads the read data "RD" from the memory 100.

Next, the command sequence of the bundle mode will be described. Differences from those of FIG. 16 will be mainly described below.

As shown in FIG. 17, the processor 230 first outputs a prefix command "YYh" for giving an instruction of the bundle mode of the read operation to the memory 100, and asserts the command latch enable signal CLE at the "H" level. The subsequent operation of the processor 230 is the same as that of the command sequence in FIG. 16.

The memory 100 executes the read operation in the bundle mode in response to the commands "YYh" and "30h".

1.4.3 Read Operation of Memory

Next, the read operation of the memory 100 will be described with reference to FIG. 18.

As shown in FIG. 18, the memory 100 first receives the read instruction from the controller 200 (step S111).

When the prefix command "YYh" is not received (step S112_No), i.e., when the read instruction of the normal mode is received, the sequencer 15 selects the normal mode (step S113).

When the prefix command "YYh" is received (step S112_Yes), i.e., when the write instruction of the bundle mode is received, the sequencer 15 selects the bundle mode (step S114).

Next, the sequencer 15 executes the read operation (step S115). When the normal mode is selected, the row decoders 19A and 19B apply read voltages to one of the word line WLa0 to WLa7 and WLb0 to WLb7 of the selected block BLK. Furthermore, when the bundle mode is selected, the row decoders 19A and 19B apply read voltages to one of the word line WLa0 to WLa7 of the selected block BLK, and one of the word lines WLb0 to WLb7 provided in the same layer. More specifically, for example, the row decoders 19A and 19B apply the read voltages to the word lines WLa0 and WLb0 of the selected block BLK.

The sequencer 15 outputs the read data according to the read enable signal REn (step S116).

1.4.4 Voltage of Each Interconnection During Read Operation

Figure 19:
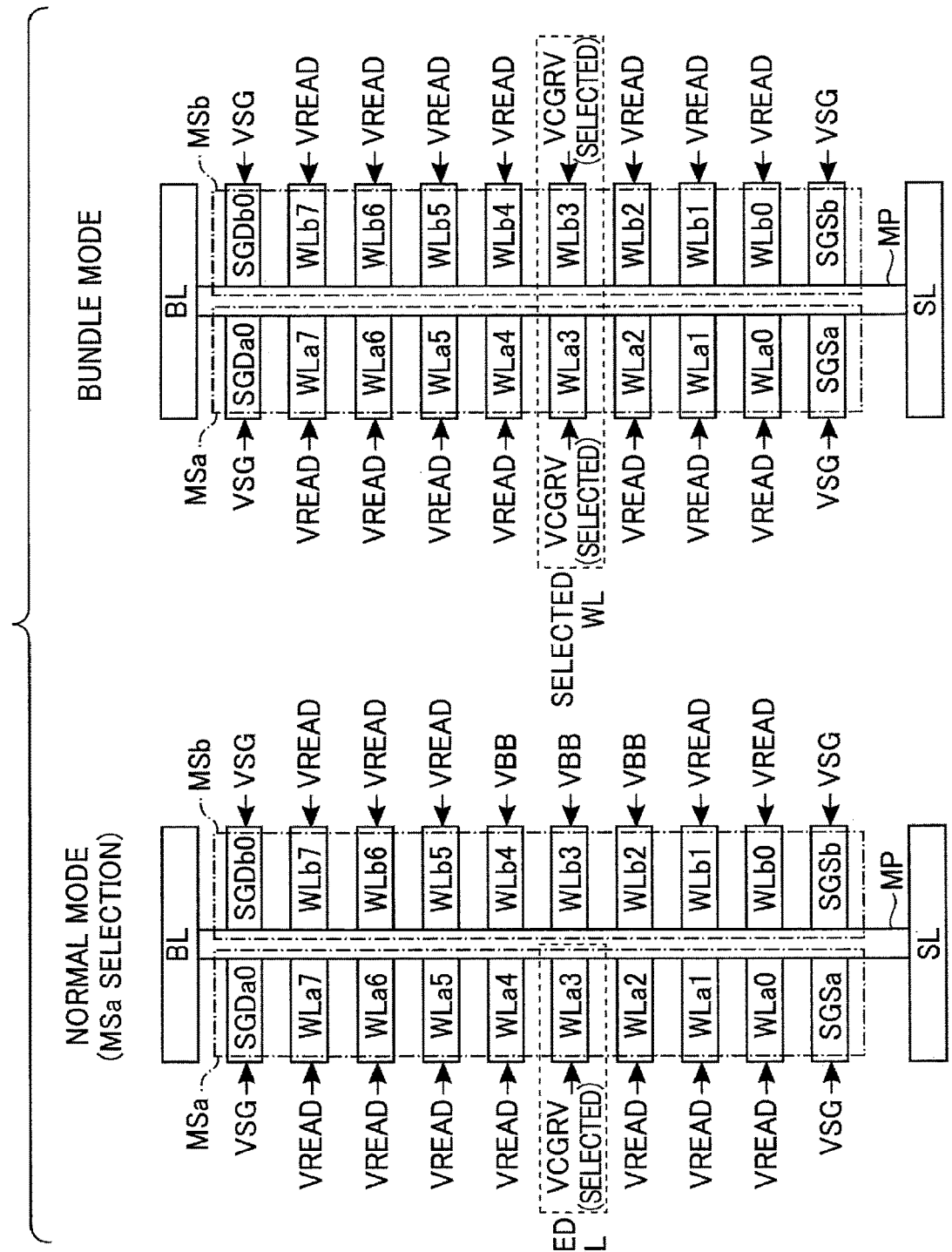
FIG. 19 is a view showing one example of a voltage of each interconnection in the read operation of the semiconductor memory device according to the first embodiment.
Figure 20:
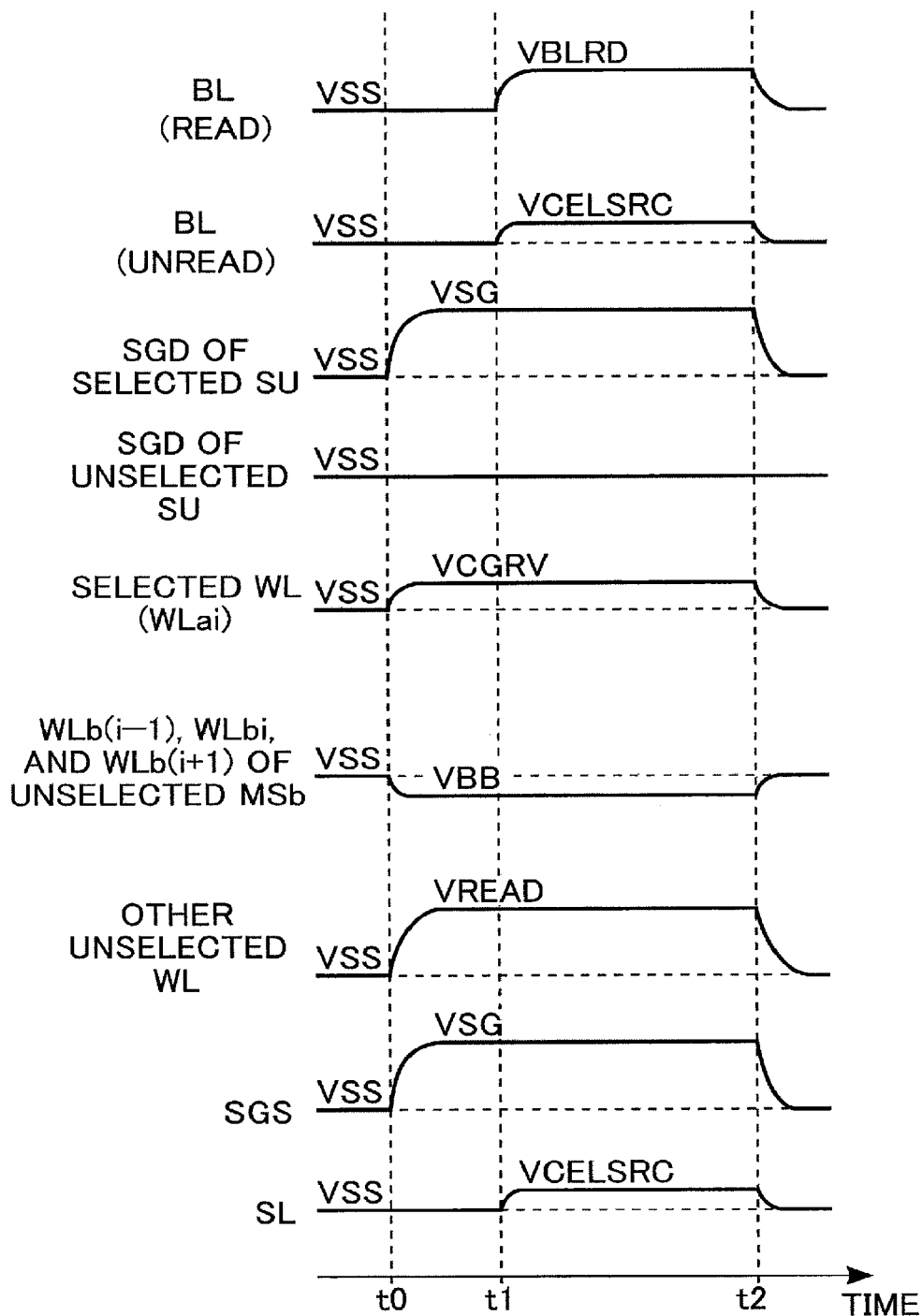
FIG. 20 is a timing chart showing a voltage of each interconnection in the read operation in the normal mode of the semiconductor memory device according to the first embodiment.

Next, the voltage of each interconnection during the read operation will be described with reference to FIGS. 19 to 21. FIG. 19 shows one example of the voltage applied to each interconnection during the read operation. FIG. 20 shows the voltage of each interconnection in the normal mode, and FIG. 21 shows the voltage of each interconnection in the bundle mode. Examples of FIGS. 19 to 21 show a case that, in the normal mode, the word line WLa3 of the string unit SU0 is selected and, in the bundle mode, the word lines WLa3 and WLb3 of the string unit SU0 are selected. In addition, the same is true of the case where the other word lines WL are selected.

In the following description, a variable i is used for numbers of the word lines WL and the memory cell transistors MC for ease of description. The variable i is, for example, a variable held by a counter (not shown) included in the controller 200, and is incremented under control of the controller 200.

When the word line WLa3 (WLai; i=3) is selected in the normal mode as shown in FIG. 19, the row decoder 19A applies a read voltage VCGRV to the selected word line WLa3 in the select memory string MSa, and applies a voltage VREAD to the unselected word lines WLa0 to WLa2 and WLa4 to WLa7. The voltage VCGRV is a voltage corresponding to a threshold voltage level of read target data. The voltage VREAD is a voltage which turns the memory cell transistor MC into the on state irrespectively of the threshold voltage of the memory cell transistor MC. The voltage VCGRV and the voltage VREAD have a relationship between VCGRV<VREAD.

The row decoder 19B applies, for example, a negative voltage VBB to the WLb3 (WLbi) provided in the same layer as the word line WLa3, the word line WLb2 (WLb(i−1)) provided in the lower layer, and the word line WLb4 (WLb(i+1)) provided in the upper layer in the unselect memory string MSb. That is, the row decoder 19B applies the negative voltage VBB to word lines WLb(i−1), WLbi, and WLb(i+1) in the unselect memory string MSb. The negative voltage VBB is a voltage which turns the memory cell transistor MC into the cutoff state irrespectively of the threshold voltage of the memory cell transistor MC. In the read operation, memory cell transistors MCb(i−1), MCbi, and MCb(i+1) associated with the word lines WLb(i−1), WLbi, and WLb(i+1) of the unselect memory string MSb are turned into the off state to suppress erroneous reading.

In addition, the voltage to be applied to the word lines WLb(i−1) WLbi, and WLb(i+1) of the unselect memory string MSb may not be the negative voltage. The voltage only needs to be a voltage which turns the memory cell transistors MCb(i−1), MCbi, and MCb(i+1) into the off state. Furthermore, the number of the memory cell transistors MCb of the unselect memory string MSb to be turned into the off state is optional, and the memory cell transistors MCb only need to include the unselect memory cell transistor MCbi in the same layer. For example, the memory cell transistors MCb0 to MCb7 of the unselect memory string MSb may be turned into the off state.

Furthermore, the row decoder 19B applies the voltage VREAD to the other unselected word line. WLb0, WLb1, and WLb5 to WLb7.

Furthermore, the row decoders 19A and 19B apply the voltages VSG to the select gate lines SGDa0 and SGDb0 and the select gate lines SGSa and SGSb, respectively. The voltage VSG is a voltage which turns the select transistors STa1, STb1, STa2, and STb2 into the on state.

Next, the bundle mode will be described.

When the word lines WLa3 and WLb3 are selected in the bundle mode, the row decoders 19A and 19B apply the read voltages VCGRV to the selected word lines WLa3 and WLb3, respectively. Furthermore, the row decoder 19A applies the voltage VREAD to each of the unselected word lines WLa0 to WLa2 and WLa4 to WLa7. Furthermore, the row decoder 19B applies the voltage VREAD to each of the unselected word lines WLb0 to WLb2 and WLb4 to WLb7.

Furthermore, similarly to the normal mode, the row decoders 19A and 19B apply the voltages VSG to the select gate lines SGDa0 and SGDb0 and the select gate lines SGSa and SGSb, respectively.

Next, the voltage of each interconnection in the normal mode will be described in detail.

As shown in FIG. 20, at the time t0, the row decoders 19A and 19B apply the voltages VSG to the select gate lines SGDa0 and SGDb0 corresponding to the selected string unit SU0, and apply the voltages VSS to the select gate lines SGDa1 to SGDa3 and SGDb1 to SGDb3 corresponding to the unselected string units SU1 to SU3. Thus, the select transistors STa1 and STb1 of the selected string unit SU0 are turned into the on state, and the select transistors STa1 and STb1 of the unselected string units SU1 to SU3 are turned into the off state.

Furthermore, the row decoders 19A and 19B apply, for example, the voltages VSG to the select gate lines SGS (SGSa and SGSb). Thus, the select transistors STa2 and STb2 of the string units SU0 to SU3 are turned into the off state.

The row decoder 19A applies the read voltage VCGRV to the selected word line WL (WLai; for example, i=3). Thus, when the threshold voltage of the select memory cell transistor MCai is lower than the voltage VCGRV, the memory cell transistor MCai is turned into the on state and, when the threshold voltage is the voltage VCGRV or more, the memory cell transistor MCai is turned into the off state.

The row decoder 19B applies the negative voltage VBB to each of the unselected word lines WLb(i−1), WLbi, and WLb(i+1). Thus, the memory cell transistors MCb(i−1), MCbi, and MCb(i+1) are turned into the off state.

Furthermore, the row decoders 19A and 19B apply the voltages VREAD to each of the other unselected word lines WL (WLa0 to WLa2, WLa4 to WLa7, WLb0, WLb1, and WLb5 to WLb7). Thus, the memory cell transistors MCa0 to MCa2, MCa4 to MCa7, MCb0, MCb1, and MCb5 to MCb7 are turned into the on state.

At the time t1, the sense amplifier 21 applies a voltage VBLRD to the read target bit line BL, and applies a voltage VCELSRC to the non-read target bit line BL. The voltage VCELSRC is applied to the source line SL. The voltage VBLRD is a voltage to be applied to the read target bit line BL. The voltage VCELSRC is a voltage which is applied to the source line SL and the non-read target bit line BL. The voltage VBLRD and the voltage VCELSRC have a relationship of VBLRD>VCELSRC (>VSS).

At the times t1 to t2, the sense amplifier 21 reads data. Subsequently, at the time t2, a recovery operation is performed and the voltage of each interconnection is reset.

Next, the voltage of each interconnection in the bundle mode will be described in detail. Differences from the normal mode in FIG. 20 will be mainly described.

As shown in FIG. 21, at the time t0, the row decoders 19A and 19B apply the read voltages VCGRV to the selected word line WL (WLai and WLbi; for example, i=3). Thus, when the threshold voltage of the select memory cell transistors MCai and MCbi is lower than the voltage VCGRV, the memory cell transistors MCai and MCbi are turned into the on state and, when the threshold voltage is equal to or higher than the voltage VCGRV, the memory cell transistors MCai and MCbi are turned into the off state.

Furthermore, the row decoders 19A and 19B apply the voltages VREAD to each of the unselected word lines WL (WLa0 to WLa2, WLa4 to WLa7, WLb0 to WLb2, and WLb4 to WLb7). Thus, the memory cell transistors MCa0 to MCa2, MCa4 to MCa7, MCb0 to MCb2, and MCb4 to MCb7 are turned into the on state.

The other operations are the same as those of the normal mode.

1.5 Effect According to Present Embodiment

The configuration according to the present embodiment can suppress reduction of a storage capacity. This effect will be described in detail.

For example, there is a NAND-type flash memory adopting the twin cell structure that the memory pillar MP is in contact with the two word lines WL in the same layer, and the two memory cell transistors MC are provided in the same layer for the one memory pillar MP. When, for example, manufacturing variations cause interconnection short-circuiting between the two word lines WL provided in the same layer in the NAND-type flash memory adopting the twin cell structure, the write operation and the read operation of the memory cell transistors MC cannot normally operate. Hence, the block BLK in which interconnection short-circuiting occurred between the word lines WL in the same layer is made unusable (referred to as a "bad block" below). As a result, an effective storage capacity of the memory 100 decreases.

By contrast with this, the configuration according to the present embodiment includes the two operation modes of the normal mode and the bundle mode in the write operation and the read operation. In the normal mode, one of the two word lines WL provided in the same layer in the one block BLK can be selected. That is, it is possible to select the one of the memory cell transistors MC of the twin cell structure. Furthermore, in the bundle mode, both of the two word lines WL provided in the same layer in the one block BLK can be selected. That is, it is possible to select the two memory cell transistors MC of the twin cell structure. Consequently, it is possible to select the bundle mode for the block BLK in which interconnection short-circuiting occurred between the word lines WL in the same layer, and execute the write operation and the read operation. As a result, the block BLK in which the interconnection short-circuiting occurred between the word lines WL in the same layer does not become a bad block and can be used, so that it is possible to suppress a decrease in the effective storage capacity of the memory 100.

Furthermore, the configuration according to the present embodiment holds data in the bundle mode and consequently can suppress erroneous reading even when interconnection short-circuiting occurs between the word lines WL in the same layer. Consequently, it is possible to improve reliability of the semiconductor memory device.

Furthermore, the configuration according to the present embodiment can save the block BLK in which interconnection short-circuiting occurred between the word lines WL in the same layer from being converted into a bad block by using the bundle mode, so that it is possible to reduce a chip defect rate during manufacturing inspection of the memory 100, for example. Consequently, it is possible to suppress a decrease in a manufacturing yield rate.

2. Second Embodiment

Next, the second embodiment will be described. The second embodiment will describe three examples of a method of setting a normal mode and a bundle mode. Differences from those of the first embodiment will be mainly described below.

2.1 First Example

First, the first example will be described. The first example will describe a case where an operation mode is set based on a pre-shipping inspection result with reference to FIG. 22. FIG. 22 is a table showing a relationship between a product pre-shipping inspection result and the operation mode.

As shown in FIG. 22, the pre-shipping inspection in the manufacturing processes inspects interconnection short-circuiting (also referred to as "intra-layer short-circuiting" below) which occurred in word lines WL in the same layer in each block BLK, such as word lines WLa0 and WLb0, and interconnection short-circuiting (also referred to as "inter-layer short-circuiting" below) which occurred in the word lines WL in different layers, such as word lines WLa0 and WLa1. As a result, when passing the inspection of both of intra-layer short-circuiting and inter-layer short-circuiting, this block BLK is decided as the normal block BLK, and can be used in a normal mode. When failing the inspection of intra-layer short-circuiting and passing the inspection of inter-layer short-circuiting, this block BLK is decided to have caused intra-layer short-circuiting and can be used in the bundle mode. Furthermore, when failing the inspection of inter-layer short-circuiting irrespectively of an inspection result of intra-layer short-circuiting, this block BLK is decided as unusable, and is converted into a bad block.

These results are written as block address information in, for example, a management region of a memory cell array 18 of a memory 100 or a register which holds system information. Consequently, one of a normal mode and a bundle mode is allocated to each block BLK in the memory 100 before the product shipping.

A controller 200 reads block address information related to an operation mode from the memory 100, and selects the operation mode based on the block address information.

2.2 Second Example

Next, the second example will be described. The second example will describe a case where the operation mode is determined based on an influence of aging deterioration after product shipping with reference to FIG. 23.

Figure 23:
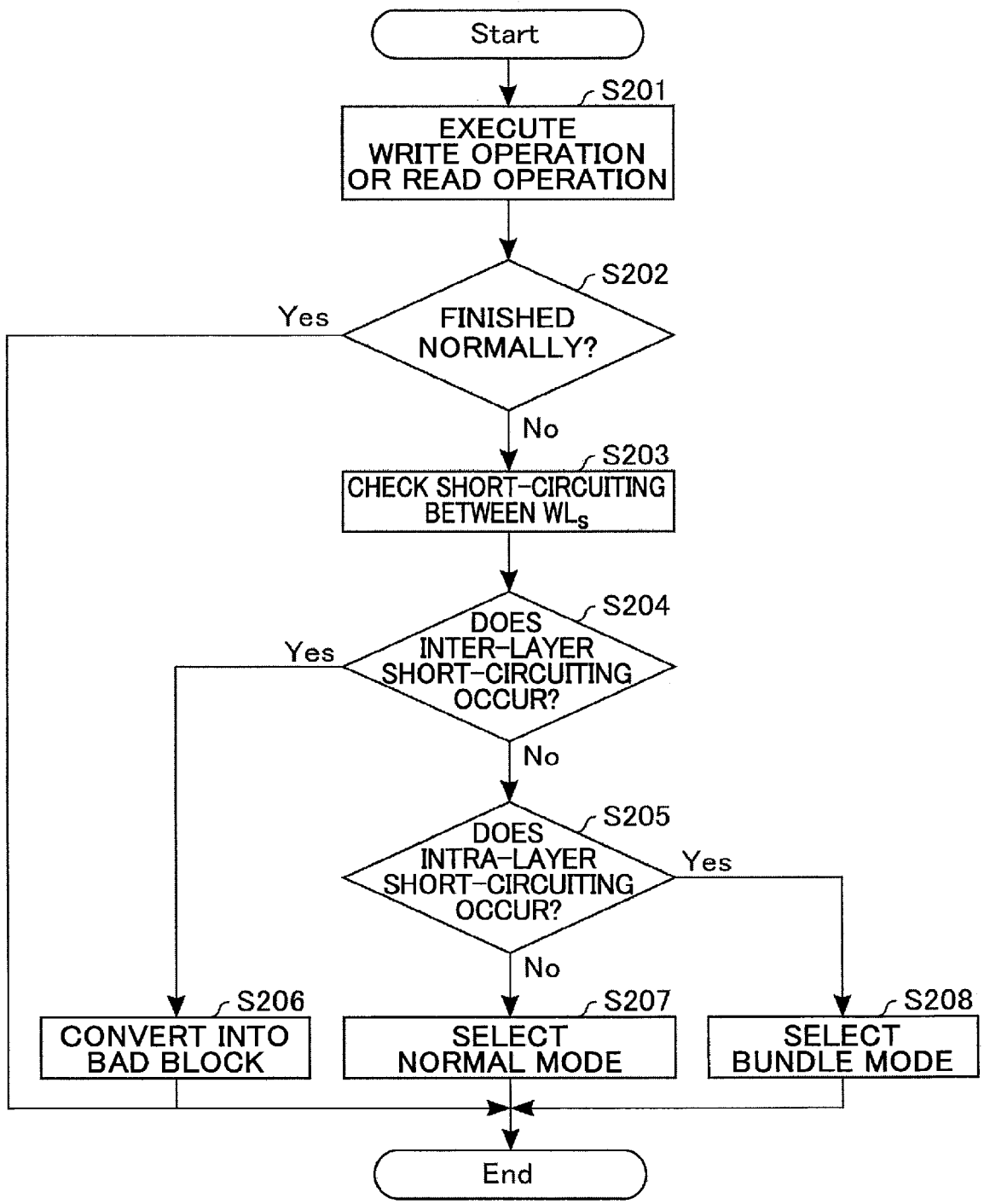
FIG. 23 is a flowchart of interconnection short-circuiting check of word lines of a memory system according to a second example of the second embodiment.

As shown in FIG. 23, a memory system 1 executes a write operation or a read operation (step S201).

When the write operation or the read operation is normally finished (step S202_Yes), processing of step S203 and subsequent steps is not executed.

When the write operation or the reading operation is not normally finished (step S202_No), more specifically, when, for example, a program loop count reaches an upper limit count during the write operation or the number of error bits of read data exceeds the number of bits which can be corrected by ECC processing during the read operation, a processor 230 executes short-circuiting check between the word lines WL (step S203). For example, according inter-layer interconnection short-circuiting check, different voltages are applied to even-numbered word lines WL0, WL2, WL4, and WL6 and odd-numbered word lines WL1, WL3, WL5, and WL7 to check whether or not interconnection short-circuiting occurs. Furthermore, according to, for example, intra-layer interconnection short-circuiting check, different voltages are applied to a word line WLa and a word line WLb in the same layer to check whether or not interconnection short-circuiting occurs.

When inter-layer interconnection short-circuiting occurs (step S204_Yes), the processor 230 converts the target block BLK into a bad block to make unusable (step S206). More specifically, when the target block BLK includes effective data which can be saved, the processor 230 moves data to the another block BLK, and then transmits parameter information related to bad block conversion to the memory 100. The memory 100 updates block address information (changes allocation of the operation mode to the block BLK) based on the parameter information.

When inter-layer interconnection short-circuiting does not occur (step S204_No), a check result of intra-layer interconnection short-circuiting is confirmed.

When intra-layer interconnection short-circuiting does not occur (step S205_No), the processor 230 selects the normal mode (step S207). The target block BLK is used in the normal mode, and therefore the processor 230 does not update the block address information.

When intra-layer interconnection short-circuiting occurs (step S205_Yes), the processor 230 selects the bundle mode (step S208). More specifically, when the target block BLK is used in the normal mode, and when there is effective data which can be saved, the processor 230 moves data to the another block BLK, and then transmits parameter information related to the bundle mode to the memory 100. The memory 100 updates the block address information based on the parameter information. Furthermore, when the target block BLK is used in the bundle mode, the processor 230 does not update the block address information.

2.3 Third Example

Next, the third example will be described. The third example will describe a case where the operation mode is selected according to data.

For example, one of the normal mode and the bundle mode is allocated to each block such that the blocks BLK corresponding to a user region of the memory cell array 18 support the normal mode, and the blocks BLK corresponding to a management region supports the bundle mode.

Consequently, for example, the processor 230 selects the normal mode when executing the write operation and the read operation in the blocks BLK corresponding to the user region, and selects the bundle mode when executing the write operation and the read operation in the blocks BLK corresponding to the management region.

In addition, the blocks BLK to which the normal mode and the bundle mode are allocated can be optionally set.

2.4 Effect According to Present Embodiment

The present embodiment is applicable to the first embodiment. In addition, a combination of a plurality of the first example to the third example may be applied to the first embodiment.

Furthermore, the configuration according to the first example of the present embodiment reduces a bad block occurrence frequency in the pre-shipping inspection of the product, and consequently can suppress a decrease in a product yield rate.

Furthermore, the configuration according to the second example of the present embodiment can suppress an increase in bad blocks due to aging deterioration of the product. Consequently, it is possible to suppress a decrease in an effective storage capacity of the product in use.

Furthermore, the configuration according to the third example of the present embodiment can apply the bundle mode even to the blocks BLK in which intra-layer short-circuiting of the word lines WL does not occur. It is possible to suppress erroneous reading in the blocks BLK which support the bundle mode even when intra-layer short-circuiting occurs, so that it is possible to improve data reliability.

3. Third Embodiment

Next, the third embodiment will be described. The third embodiment will describe a case where a memory 100 selects an operation mode. Differences from those of the first embodiment will be mainly described below.

3.1 Write Operation 3.1.1 Entire Flow of Write Operation

First, the entire flow of the write operation will be described. In the present embodiment, when receiving a write request from a host device 2, a processor 230 does not select an operation mode in step S11 in FIG. 9 according to the first embodiment, and transmits a write instruction to the memory 100. More specifically, the processor 230 transmits a command sequence described with reference to FIG. 10 in the first embodiment to the memory 100.

3.1.2 Write Operation of Memory

Next, the write operation of the memory 100 will be described with reference to FIG. 24.

Figure 24:
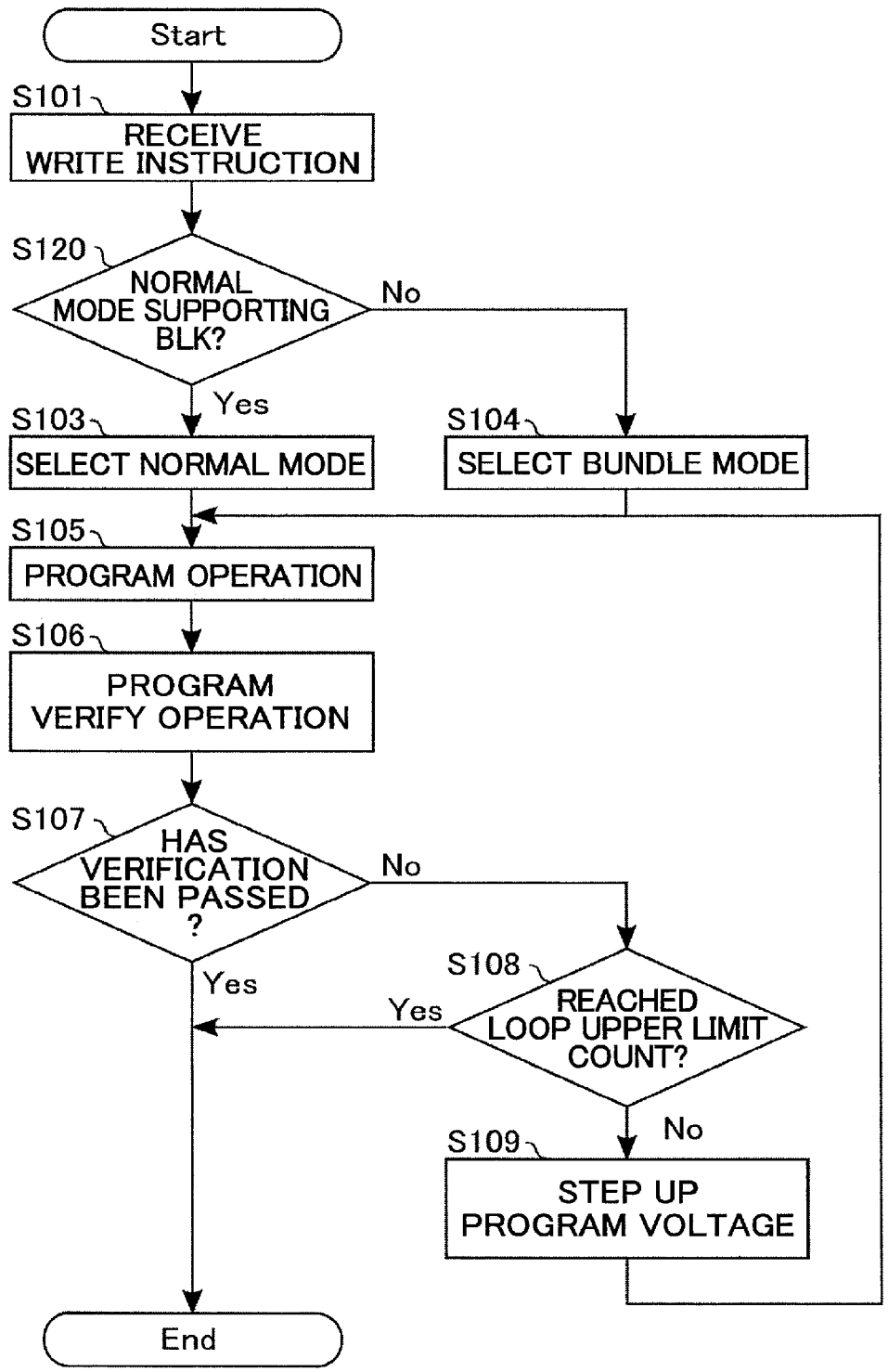
FIG. 24 is a flowchart in the write operation of the semiconductor memory device according to a third embodiment.

As shown in FIG. 24, the memory 100 first receives a write instruction from a controller 200 (step S101). A sequencer 15 refers to block address information stored in, for example, a management region, and confirms an address ADD (block address) received from the controller 200.

When a selected block BLK is a normal mode supporting block BLK (step S120_Yes), the sequencer 15 selects the normal mode (step S103).

On the other hand, when the selected block BLK is a bundle mode supporting block BLK (step S120_No), the sequencer 15 selects the bundle mode (step S104).

The operation of step S105 and subsequent steps is the same as that in FIG. 12 according to the first embodiment.

3.2 Read Operation 3.2.1 Entire Flow of Read Operation

Next, the entire flow of the read operation will be described. In the present embodiment, when receiving a read request from the host device 2, the processor 230 does not select the operation mode in step S21 in FIG. 15 according to the first embodiment, and transmits a read instruction to the memory 100. More specifically, the processor 230 transmits the command sequence described with reference to FIG. 16 in the first embodiment to the memory 100.

3.2.2 Read Operation of Memory

Next, the read operation of the memory 100 will be described with reference to FIG. 25.

As shown in FIG. 25, the memory 100 first receives the read instruction from the controller 200 (step S111). The sequencer 15 refers to block address information stored in, for example, a management region, and confirms an address ADD (block address) received from the controller 200.

When the selected block BLK is the normal mode supporting block BLK (step S130_Yes), the sequencer 15 selects the normal mode (step S113).

When the selected block BLK is the bundle mode supporting block BLK (step S130_No), the sequencer 15 selects the bundle mode (step S114).

Next, similarly to FIG. 18 according to the first embodiment, the sequencer 15 executes the read operation (step S115).

3.3 Effect According to Present Embodiment

The configuration according to the present embodiment can obtain the same effect as that of the first embodiment.

In addition, the second embodiment and the third embodiment may be combined.

4. Modifications

The memory system according to the above-described embodiments includes: a semiconductor memory device (100); and a controller (200) configured to control the semiconductor memory device. The semiconductor memory device includes: a plurality of first interconnection layers (31;WLa) stacked in a first direction (Z direction); a plurality of second interconnection layers (31;WLb) stacked in the first direction, the second interconnection layers respectively disposed apart from one of the first interconnection layers in a second direction (Y direction) intersecting the first direction; a semiconductor pillar (48) provided between the first interconnection layers and the second interconnection layers, and extending in the first direction; a first charge storage layer (46) disposed between the first interconnection layers and the semiconductor pillar; and a second charge storage layer (46) disposed between the second interconnection layers and the semiconductor pillar. The semiconductor memory device is configured to execute an operation in a first mode (normal mode) or in a second mode (bundle mode). In the first mode, the device selects a third interconnection layer among the first interconnection layers independently with a fourth interconnection layer among the second interconnection layers disposed apart in the second direction from the third interconnection layer. In the second mode, the device selects a fifth interconnection layer among the first interconnection layers, and sixth interconnection layer among the second interconnection layers disposed apart in the second direction from the fifth interconnection layer in a batch. The controller is configured to send an instruction to the device to execute the operation in the first mode or the second mode.

By applying the above embodiments, it is possible to provide a memory system which can suppress a decrease in the storage capacity.

In addition, the embodiments are not limited to the above-described embodiments, and can be variously modified.

For example, the above embodiments have described a twin cell structure that two memory cell transistors MC corresponding to one memory pillar MP are provided in the same layer, yet are not limited to these. For example, the four memory cell transistors MC corresponding to the one memory pillar MP may be provided in the same layer. That is, the memory pillar MP may be in contact with four word lines WL provided in the same layer.

Furthermore, in the above embodiments, the same voltage VPGM is applied to selected word lines WLa and WLb(e.g., word lines WLa3 and WLb3 in FIG. 13) in the bundle mode. However, the voltage to be applied to the selected word line WLa and the voltage to be applied to the selected word line WLb may include an error produced by a manufacturing or design variation.

Furthermore, "coupling" in the above embodiments includes a state of indirect coupling with another component such as a transistor or a resistance interposed in-between.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory device; and
a controller configured to control the semiconductor memory device,
wherein the semiconductor memory device includes:
a plurality of first interconnection layers stacked in a first direction;
a plurality of second interconnection layers stacked in the first direction, the second interconnection layers respectively disposed apart from one of the first interconnection layers in a second direction intersecting the first direction;
a semiconductor pillar provided between the first interconnection layers and the second interconnection layers, and extending in the first direction;
a first charge storage layer disposed between the first interconnection layers and the semiconductor pillar; and
a second charge storage layer disposed between the second interconnection layers and the semiconductor pillar, wherein the semiconductor memory device is configured to execute an operation in a first mode or in a second mode, in the first mode, the device selects a third interconnection layer among the first interconnection layers independently with a fourth interconnection layer among the second interconnection layers disposed apart in the second direction from the third interconnection layer, in the second mode, the device selects a fifth interconnection layer among the first interconnection layers, and sixth interconnection layer among the second interconnection layers disposed apart in the second direction from the fifth interconnection layer in a batch, and
the controller is configured to send an instruction to the device to execute the operation in the first mode or the second mode.

2. The system according to claim 1, wherein,
in a write operation, when the first mode is selected, a first voltage is applied to the third interconnection layer, and a second voltage lower than the first voltage is applied to the fourth interconnection layer, and, when the second mode is selected, the first voltage is applied to the fifth and sixth interconnection layers.

3. The system according to claim 2, wherein,
in the write operation, when the first mode is selected, the second voltage is applied to the other first interconnection layers except the third interconnection layer among the first interconnection layers, and the other second interconnection layers except the fourth interconnection layer among the second interconnection layers, and, when the second mode is selected, the second voltage is applied to the other first interconnection layers except the fifth interconnection layer among the first interconnection layers, and the other second interconnection layers except the sixth interconnection layer among the second interconnection layers.

4. The system according to claim 1, wherein,
in a read operation, when the first mode is selected, a third voltage is applied to the third interconnection layer, and a fourth voltage lower than the third voltage is applied to the fourth interconnection layer, and, when the second mode is selected, the third voltage is applied to the fifth and sixth interconnection layers.

5. The system according to claim 4, wherein,
in the read operation, when the first mode is selected, a fifth voltage higher than the third voltage is applied to the other first interconnection layers except the third interconnection layer among the first interconnection layers, and, when the second mode is selected, the fifth voltage is applied to the other first interconnection layers except the fifth interconnection layer among the first interconnection layers.

6. The system according to claim 4, wherein,
in the read operation, when the first mode is selected, the fourth voltage is applied to seventh interconnection layer adjacent to the fourth interconnection layer in the first direction among the second interconnection layers.

7. The system according to claim 1, wherein,
the semiconductor memory device holds information related to the first mode and the second mode, and
the controller selects one of the first mode and the second mode based on the information.

8. The system according to claim 1, wherein,
when selecting the second mode, the controller gives a command of the second mode to a write instruction and a read instruction to be transmitted to the semiconductor memory device.

9. The system according to claim 1, wherein,
when the first interconnection layers and the second interconnection layers are non-electrically coupled, the controller selects the first mode in a block including the first interconnection layers and the second interconnection layers, and
when at least one of the first interconnection layers and at least one of the second interconnection layers are electrically coupled, the controller selects the second mode in the block.

10. The system according to claim 1, wherein,
the semiconductor memory device further includes:
a contact plug provided on the semiconductor pillar; and
an eighth interconnection layer provided on the contact plug and extending in the second direction.

11. A semiconductor memory device comprising:
a plurality of first interconnection layers stacked in a first direction;
a plurality of second interconnection layers stacked in the first direction, the second interconnection layers respectively disposed apart from one of the first interconnection layers in a second direction intersecting the first direction;
a semiconductor pillar provided between the first interconnection layers and the second interconnection layers, and extending in the first direction;
a first charge storage layer disposed between the first interconnection layers and the semiconductor pillar; and
a second charge storage layer disposed between the second interconnection layers and the semiconductor pillar, and
wherein an operation in a first mode or in a second mode is executed, in the first mode, a third interconnection layer among the first interconnection layers is selected independently with a fourth interconnection layer among the second interconnection layers disposed apart in the second direction from the third interconnection layer, in the second mode, a fifth interconnection layer among the first interconnection layers, and sixth interconnection layer among the second interconnection layers disposed apart in the second direction from the fifth interconnection layer are selected in a batch.

12. The device according to claim 11, wherein,
in a write operation, when the first mode is selected, a first voltage is applied to the third interconnection layer, and a second voltage lower than the first voltage is applied to the fourth interconnection layer, and, when the second mode is selected, the first voltage is applied to the fifth and sixth interconnection layers.

13. The device according to claim 12, wherein,
in the write operation, when the first mode is selected, the second voltage is applied to the other first interconnection layers except the third interconnection layer among the first interconnection layers, and the other second interconnection layers except the fourth interconnection layer among the second interconnection layers, and, when the second mode is selected, the second voltage is applied to the other first interconnection layers except the fifth interconnection layer among the first interconnection layers, and the other second interconnection layers except the sixth interconnection layer among the second interconnection layers.

14. The device according to claim 11, wherein,
in a read operation, when the first mode is selected, a third voltage is applied to the third interconnection layer, and a fourth voltage lower than the third voltage is applied to the fourth interconnection layer, and, when the second mode is selected, the third voltage is applied to the fifth and sixth interconnection layers.

15. The device according to claim 14, wherein,
in the read operation, when the first mode is selected, a fifth voltage higher than the third voltage is applied to the other first interconnection layers except the third interconnection layer among the first interconnection layers, and, when the second mode is selected, the fifth voltage is applied to the other first interconnection layers except the fifth interconnection layer among the first interconnection layers.

16. The device according to claim 14, wherein,
in the read operation, when the first mode is selected, the fourth voltage is applied to seventh interconnection layer adjacent to the fourth interconnection layer in the first direction among the second interconnection layers.

17. The device according to claim 11, wherein
the first mode or the second mode is selected based on an address included in an instruction received from an external controller.

18. The device according to claim 11, wherein,
when the first interconnection layers and the second interconnection layers are non-electrically coupled, the first mode is selected in a block including the first interconnection layers and the second interconnection layers, and,
when at least one of the first interconnection layers and at least one of the second interconnection layers are electrically coupled, the second mode is selected in the block.

19. The device according to claim 11, further comprising:
a contact plug provided on the semiconductor pillar; and
an eighth interconnection layer provided on the contact plug and extending in the second direction.

20. A semiconductor memory device comprising:
a plurality of first interconnection layers stacked in a first direction;
a plurality of second interconnection layers stacked in the first direction; the second interconnection layers respectively disposed apart from one of the first interconnection layers in a second direction intersecting the first direction;
a semiconductor pillar provided between the first interconnection layers and the second interconnection layers, and extending in the first direction;
a first charge storage layer disposed between the first interconnection layers and the semiconductor pillar; and
a second charge storage layer disposed between the second interconnection layers and the semiconductor pillar,
wherein a third interconnection layer among the first interconnection layers is selected independently with a fourth interconnection layer among the second interconnection layers disposed apart in the second direction from the third interconnection layer, and
a fifth interconnection layer among the first interconnection layers, and sixth interconnection layer among the second interconnection layers disposed apart in the second direction from the fifth interconnection layer are selected in a batch.

* * * * *